(12) United States Patent
Liang et al.

(10) Patent No.: US 9,048,101 B2
(45) Date of Patent: Jun. 2, 2015

(54) ESD PROTECTION CIRCUIT

(75) Inventors: Yung-Chih Liang, New Taipei (TW); Chih-Ting Yeh, Zhudong Township (TW)

(73) Assignee: Industrial Technology Research Institute, Chutung (TW)

( * ) Notice: Subject to any disclaimer, the term of this patent is extended or adjusted under 35 U.S.C. 154(b) by 982 days.

(21) Appl. No.: 13/149,176

(22) Filed: May 31, 2011

(65) Prior Publication Data

US 2012/0161216 A1 Jun. 28, 2012

(30) Foreign Application Priority Data

Dec. 28, 2010 (TW) .............................. 99146287 A

(51) Int. Cl.
| | | |
|---|---|---|
| *H01L 27/02* | (2006.01) | |
| *H01L 23/60* | (2006.01) | |
| *H01L 23/62* | (2006.01) | |
| *H02H 9/04* | (2006.01) | |
| *H02H 3/20* | (2006.01) | |

(52) U.S. Cl.
CPC ..... *H01L 27/0285* (2013.01); *H01L 2924/0002* (2013.01)

(58) Field of Classification Search
CPC ............ H01L 27/0251; H01L 27/0266; H01L 27/0255; H01L 27/0248; H01L 27/0262
USPC ............ 257/173, 355, 360; 327/428; 361/56, 361/111
See application file for complete search history.

(56) References Cited

U.S. PATENT DOCUMENTS

| | | | | |
|---|---|---|---|---|
| 5,452,171 | A | * | 9/1995 | Metz et al. ...................... 361/56 |
| 5,530,612 | A | | 6/1996 | Maloney |
| 5,825,600 | A | | 10/1998 | Watt |
| 6,008,684 | A | | 12/1999 | Ker et al. |
| 6,081,002 | A | | 6/2000 | Amerasekera et al. |
| 6,130,117 | A | | 10/2000 | Walker et al. |

(Continued)

FOREIGN PATENT DOCUMENTS

| | | |
|---|---|---|
| TW | 429587 | 4/2001 |
| TW | 503558 | 9/2002 |

(Continued)

OTHER PUBLICATIONS

Office Action of corresponding TW application, issued on Aug. 8, 2013.

(Continued)

*Primary Examiner* — Marvin Payen
*Assistant Examiner* — Jeremy Joy
(74) *Attorney, Agent, or Firm* — Wang Law Firm, Inc.; Li K. Wang; Stephen Hsu

(57) ABSTRACT

One embodiment of the disclosure provides an electrostatic discharge protection circuit, including a first resistor, a p-type field effect transistor, a capacitance device and an n-type field effect transistor. The first resistor has a first terminal coupled to a first rail and a second terminal coupled to a first node. The p-type field effect transistor has a source coupled to the first rail, a gate coupled to the first node and a drain coupled to a second node. The capacitance device has a first terminal coupled to a second rail or the second node and a second terminal coupled to the first node. The n-type field effect transistor has a source coupled to the second rail, a gate coupled to the second node and a drain coupled to the first node.

20 Claims, 18 Drawing Sheets

(56) References Cited

U.S. PATENT DOCUMENTS

| | | |
|---|---|---|
| 6,671,153 B1 | 12/2003 | Ker et al. |
| 6,764,892 B2 | 7/2004 | Kunz et al. |
| 6,858,902 B1 | 2/2005 | Salling et al. |
| 6,867,957 B1 | 3/2005 | Tong et al. |
| 7,187,527 B2 | 3/2007 | Su et al. |
| 7,202,114 B2 | 4/2007 | Salcedo et al. |
| 7,277,263 B2 | 10/2007 | Duvvury et al. |
| 7,285,828 B2 | 10/2007 | Salcedo et al. |
| 7,427,787 B2 | 9/2008 | Steinhoff |
| 7,479,414 B2 | 1/2009 | Salcedo et al. |
| 7,586,721 B2 | 9/2009 | Wang et al. |
| 7,601,991 B2 | 10/2009 | Salcedo et al. |
| 7,667,243 B2 | 2/2010 | Duvvury et al. |
| 7,746,609 B2 | 6/2010 | Kim |
| 7,755,871 B2 | 7/2010 | Ker et al. |
| 2002/0033507 A1 | 3/2002 | Verhaege et al. |
| 2003/0047787 A1* | 3/2003 | Cheng et al. ............... 257/360 |
| 2003/0222273 A1 | 12/2003 | Kunz et al. |
| 2005/0057866 A1* | 3/2005 | Mergens et al. ............. 361/56 |
| 2006/0044718 A1 | 3/2006 | Su et al. |
| 2006/0050453 A1 | 3/2006 | Duvvury et al. |
| 2006/0151836 A1 | 7/2006 | Salcedo et al. |
| 2006/0273399 A1 | 12/2006 | Liu et al. |
| 2007/0007545 A1 | 1/2007 | Salcedo et al. |
| 2007/0109698 A1 | 5/2007 | Kim |
| 2007/0206339 A1* | 9/2007 | Choi ............................ 361/111 |
| 2007/0236842 A1* | 10/2007 | Choi .............................. 361/56 |
| 2007/0247772 A1 | 10/2007 | Keppens et al. |
| 2007/0284666 A1 | 12/2007 | Duvvury et al. |
| 2008/0012044 A1 | 1/2008 | Salcedo et al. |
| 2008/0044955 A1 | 2/2008 | Salcedo et al. |
| 2008/0197415 A1* | 8/2008 | Yun ............................. 257/355 |
| 2008/0199997 A1 | 8/2008 | Grebs et al. |
| 2008/0217650 A1 | 9/2008 | Morishita |
| 2008/0218922 A1 | 9/2008 | Mallikararjunaswamy et al. |
| 2008/0278873 A1 | 11/2008 | Leduc et al. |
| 2009/0015974 A1 | 1/2009 | Wang |
| 2009/0027063 A1 | 1/2009 | Scholz et al. |
| 2009/0032838 A1 | 2/2009 | Tseng |
| 2009/0073621 A1 | 3/2009 | Thijs |
| 2009/0166671 A1 | 7/2009 | Hwang |
| 2009/0268359 A1 | 10/2009 | Chatty et al. |
| 2009/0280582 A1 | 11/2009 | Thijs et al. |
| 2009/0309128 A1 | 12/2009 | Salcedo et al. |
| 2009/0323234 A1 | 12/2009 | Bach |
| 2010/0027173 A1 | 2/2010 | Wijmeersch |
| 2010/0296212 A1* | 11/2010 | Liang et al. .................. 361/56 |
| 2012/0120531 A1* | 5/2012 | Abou-Khalil et al. ........ 361/56 |

FOREIGN PATENT DOCUMENTS

| | | |
|---|---|---|
| TW | 564539 | 12/2003 |
| TW | 578242 | 3/2004 |
| TW | 200507254 | 2/2005 |
| TW | 200536097 | 11/2005 |
| TW | 200723489 | 6/2007 |
| TW | 200841454 | 10/2008 |
| TW | I308386 | 4/2009 |
| TW | I319196 | 1/2010 |
| TW | I319253 | 1/2010 |
| TW | I324383 | 5/2010 |
| TW | I326512 | 6/2010 |
| TW | I334214 B | 12/2010 |

OTHER PUBLICATIONS

"A Low Leakage Low Cost-PMOS Based Power Supply Clamp with Active Feedback for ESD Protection in 65nm CMOS Technologies"; Jeremy C. Smith, Roger A. Cline, and Gianluca Boselli; 2005 EOS/ESD Symposium.

"Design of Power-Rail ESD Clamp Circuit With Ultra-Low Standby Leakage Current in Nanoscale CMOS Technology"; Chang-Tzu Wang and Ming-Dou Ker; IEEE Journal of Solid-State Circuits, vol. 44, No. 3, Mar. 2009.

"Ultra-Low-Leakage Power-Rail ESD Clamp Circuit in Nanoscale Low-Voltage CMOS Process"; Po-Yen Chiu, Ming-Dou Ker, Fu-Yi Tsai, and Yeong-Jar Chang; IEEE 47th Annual International Reliability Physics Symposium, Montreal, 2009.

Office Action of parent U.S. Appl. No. 13/149,176, issued on Sep. 17, 2014.

Office Action of U.S. Appl. No. 13/149,176, issued on Sep. 17, 2014.

\* cited by examiner

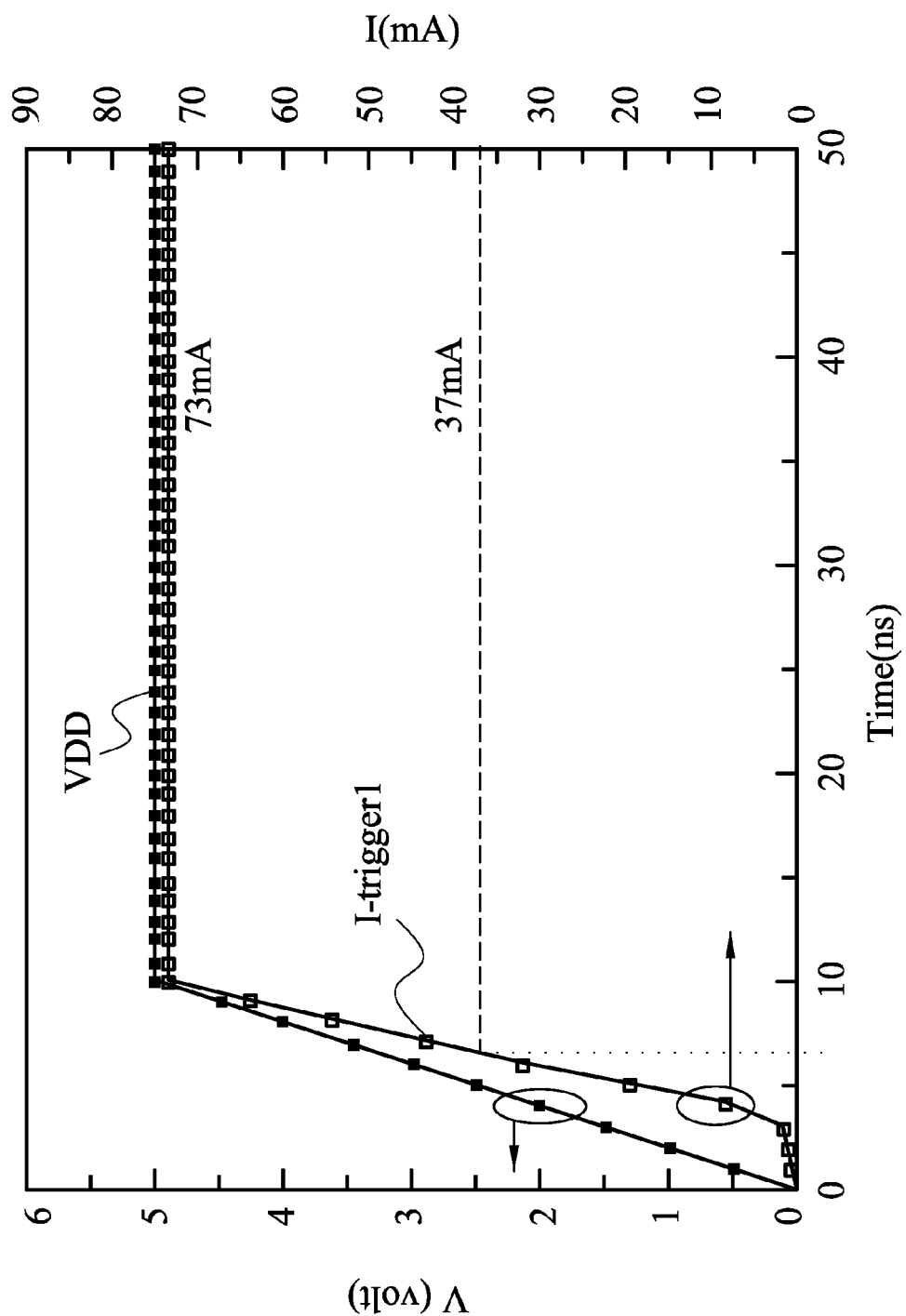

ESD PROTECTION CIRCUIT

CROSS REFERENCE TO RELATED APPLICATIONS

This Application claims priority of Taiwan Patent Application No. 099146287, filed on Dec. 28, 2010, the entirety of which is incorporated by reference herein.

BACKGROUND OF THE INVENTION

1. Field of the Invention

The invention relates to an electrostatic discharge (ESD) protection circuit, and in particular relates to an electrostatic discharge (ESD) protection circuit with low leakage, high trigger speed and parasitic silicon controlled rectifier (SCR).

2. Description of the Related Art

FIG. 1 shows a conventional electrostatic discharge protection circuit 100. The conventional protection circuit 100 has an electrostatic discharge detecting circuit 110, and the electrostatic discharge detecting circuit 110 has a trigger node 106. The trigger node 106 of the electrostatic discharge detecting circuit 110 is coupled to a silicon controlled rectifier 112. When an event of the electrostatic discharge occurs, the trigger node 106 produces a trigger current to trigger the silicon controlled rectifier 112. After the silicon controlled rectifier 112 is triggered by the trigger current, the silicon controlled rectifier 112 provides a discharge path to discharge the electrostatic discharge current from the rail $V_{DD}$ to the rail $V_{SS}$.

With the progress in process techniques, new process techniques are able to reduce the size of metal-oxide-semiconductor field effect transistor (MOSFET) into a nanometer order. Thus, the leakage current of the gate oxide of metal-oxide-semiconductor field effect transistor (MOSFET) is increased, because the thickness of the gate oxide is reduced. The on-chip electrostatic discharge protection circuit, particularly the MOS capacitor, usually adopts a large size metal-oxide-semiconductor field effect transistor (MOSFET) when designing the circuit. Therefore, the electrostatic discharge protection circuit suffers from leakage current and inefficient system power usage in normal operating mode. To solve the leakage current of MOSFETs, most of the conventional electrostatic discharge protection circuits use a thick oxide device with high mask costs and low protection ability against electrostatic discharge, such that the electrostatic protection circuits require more space to improve the protection ability. Therefore, a low leakage electrostatic protection circuit is in need.

BRIEF SUMMARY OF THE INVENTION

A detailed description is given in the following embodiments with reference to the accompanying drawings.

One embodiment of the disclosure provides an electrostatic discharge protection circuit, including a first resistor, a p-type field effect transistor, a capacitance device and an n-type field effect transistor. The first resistor has a first terminal coupled to a first rail and a second terminal coupled to a first node. The p-type field effect transistor has a source coupled to the first rail, a gate coupled to the first node and a drain coupled to a second node. The capacitance device has a first terminal coupled to a second rail or the second node and a second terminal coupled to the first node. The n-type field effect transistor has a source coupled to the second rail, a gate coupled to the second node and a drain coupled to the first node.

One embodiment of the disclosure further provides an electrostatic discharge protection circuit, including a substrate, a first resistor, a first N-well, a p-type field effect transistor, an n-type field effect transistor and a capacitance device. The substrate has a first contact point. The first resistor has a first terminal coupled to a first rail and a second terminal. The first N-well is formed on the substrate and has a second contact point coupled to the first rail. The p-type field effect transistor is formed on the first N-well and comprises a first p-type doped region, a first gate and a second p-type doped region. The first p-type doped region is formed on the first N-well, coupled to a second node. The first gate is coupled to the second terminal of the first resistor. The second p-type doped region is formed on the first N-well, coupled to the first rail. The n-type field effect transistor is formed on the substrate, including a second gate, a first n-type doped region and a second n-type doped region. The second gate is coupled to the second node. The first n-type doped region is formed on the substrate, coupled to a second rail. The second n-type doped region is formed on the substrate, coupled to the second terminal of the first resistor. The capacitance device has a first terminal coupled to the second rail or the second node and a second terminal coupled to the second terminal of the first resistor, in which the second rail is coupled to the first contact point.

BRIEF DESCRIPTION OF THE DRAWINGS

The invention can be more fully understood by reading the subsequent detailed description and examples with references made to the accompanying drawings, wherein:

FIG. 6A is a simulation diagram of trigger current in the disclosure.

DETAILED DESCRIPTION OF THE INVENTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
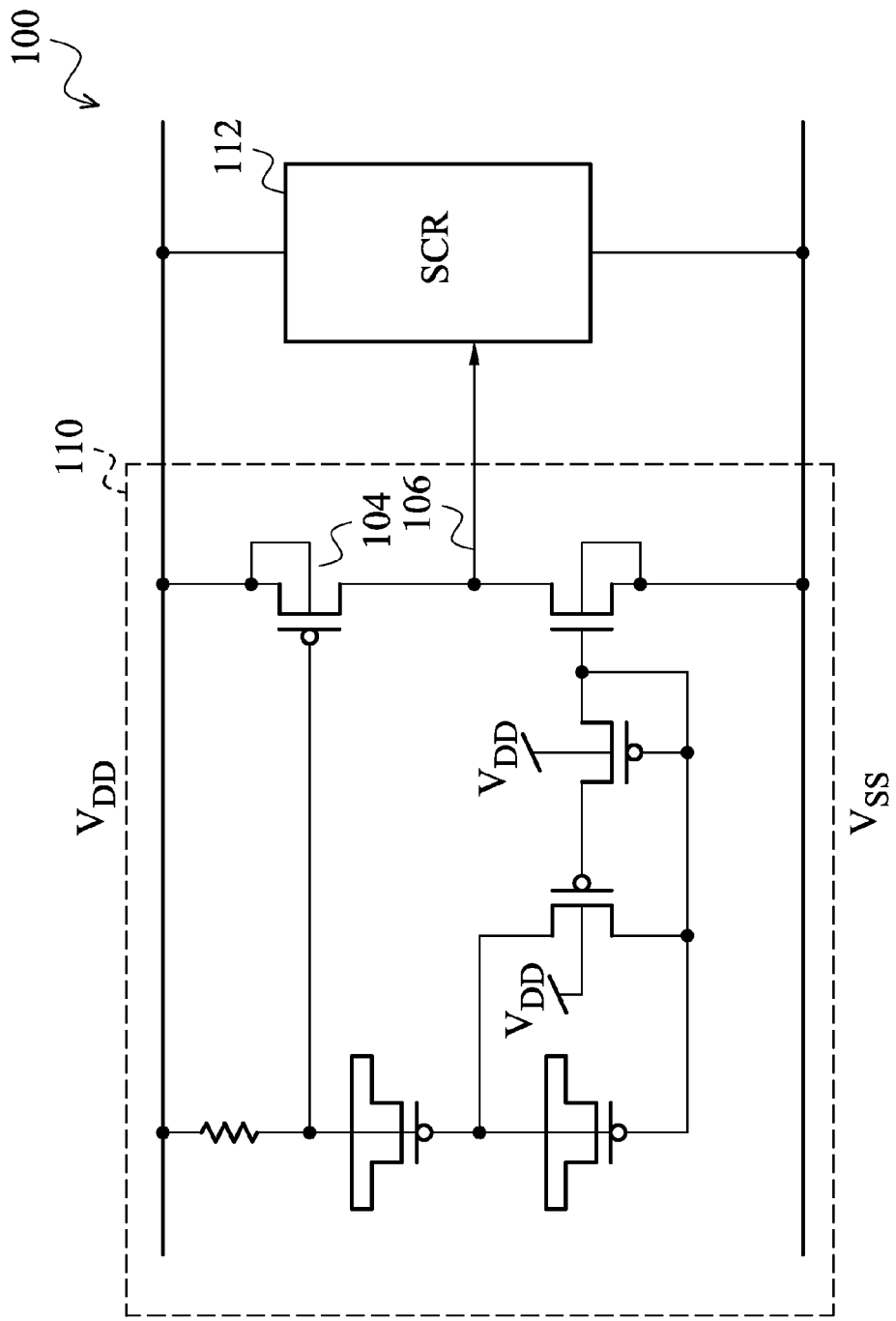
FIG. 1 is a schematic view of a conventional electrostatic discharge protection circuit.
Figure 2A:
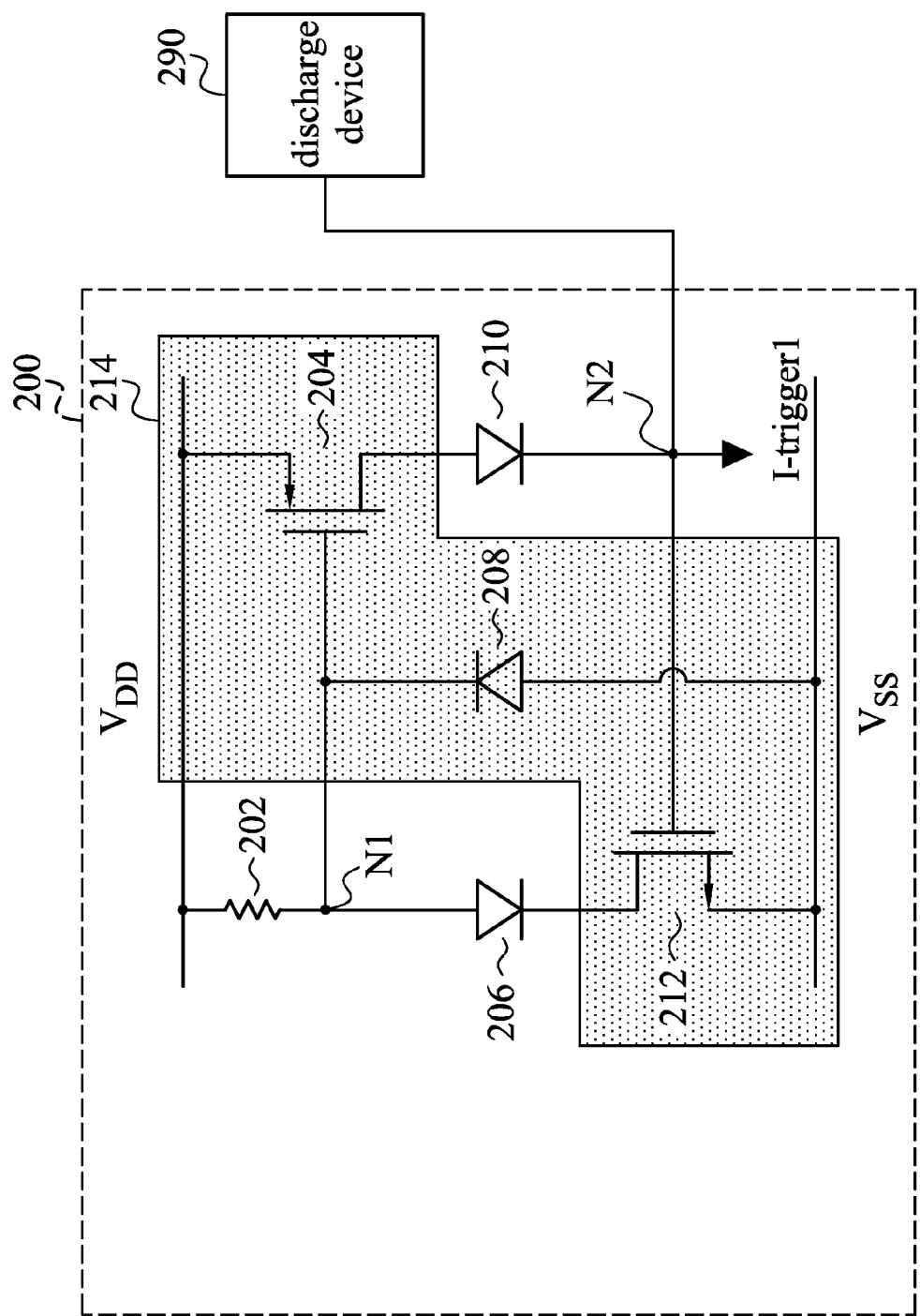
FIG. 2A is a schematic view showing an embodiment of the electrostatic discharge protection circuit.

FIG. 2A is a schematic view showing an embodiment of the electrostatic discharge protection circuit. As shown in FIG. 2A, the electrostatic discharge protection circuit 200 includes a first resistor 202, a p-type field effect transistor 204, a second diode 206, a diode device 208, a first diode 210 and a n-type field effect transistor 212. The first resistor 202 has a first terminal coupled to the rail $V_{DD}$ and a second terminal coupled to the first node N1. The p-type field effect transistor 204 has a source coupled to the rail $V_{DD}$, a gate coupled to the first node N1 and a drain coupled to the first diode 210. The first diode 210 has an anode coupled to the drain of the p-type field effect transistor 204 and a cathode coupled to the second node N2. The second diode 206 has an anode coupled to the first node N1 and a cathode coupled to the n-type field effect transistor 212. The diode device 208 has a first terminal coupled to the rail $V_{SS}$ and a second terminal coupled to the first node N1. The n-type field effect transistor 212 has a source coupled to the rail $V_{SS}$, a gate coupled to the second node N2 and a drain coupled to the cathode of the second diode 206. The trigger current I-trigger1 is inputted to a parasitic silicon controlled rectifier or a discharge device from the node N2.

It should be noted that, in the embodiment, diode device 208 serves as a capacitance device and is applied to construct an RC circuit with the first resistor 202. In some embodiment, the diode device 208 has a first terminal coupled to the second node N2 and a second terminal coupled to the first node N1, and the diode device 208 can be replaced by the other capacitance components depending on the need of applications as appropriate, such as plate capacitors, MOS capacitors or the same. Compared with the other capacitance components, the diode device 208 can reduce the area of the electrostatic discharge protection circuit 200. In addition, the electrostatic discharge protection circuit 200 further comprises a parasitic silicon controlled rectifier 214 which is constructed by the p-type field effect transistor 204 and the n-type field effect transistor 212. The parasitic silicon controlled rectifier 214 has a control terminal coupled to the second node N2, and the control terminal can trigger the parasitic silicon controlled rectifier 214 by the trigger current I-trigger1. When an electrostatic discharge event occurs, the parasitic silicon controlled rectifier 214 provides a discharge path to protect the chip. In another embodiment, the electrostatic discharge protection circuit 200 can further be coupled to the discharge device 290 (ex. clamp device or other silicon controlled rectifier device) between the rail $V_{DD}$ and $V_{SS}$. In the electrostatic discharge event, the discharge device 290 can be triggered by the electrostatic discharge protection circuit 200 from the second node N2 and provides a discharge path for the chip. Note that, the electrostatic discharge protection circuit 200 can be regarded as a detecting circuit after being coupled to the discharge device 290.

Figure 2B:
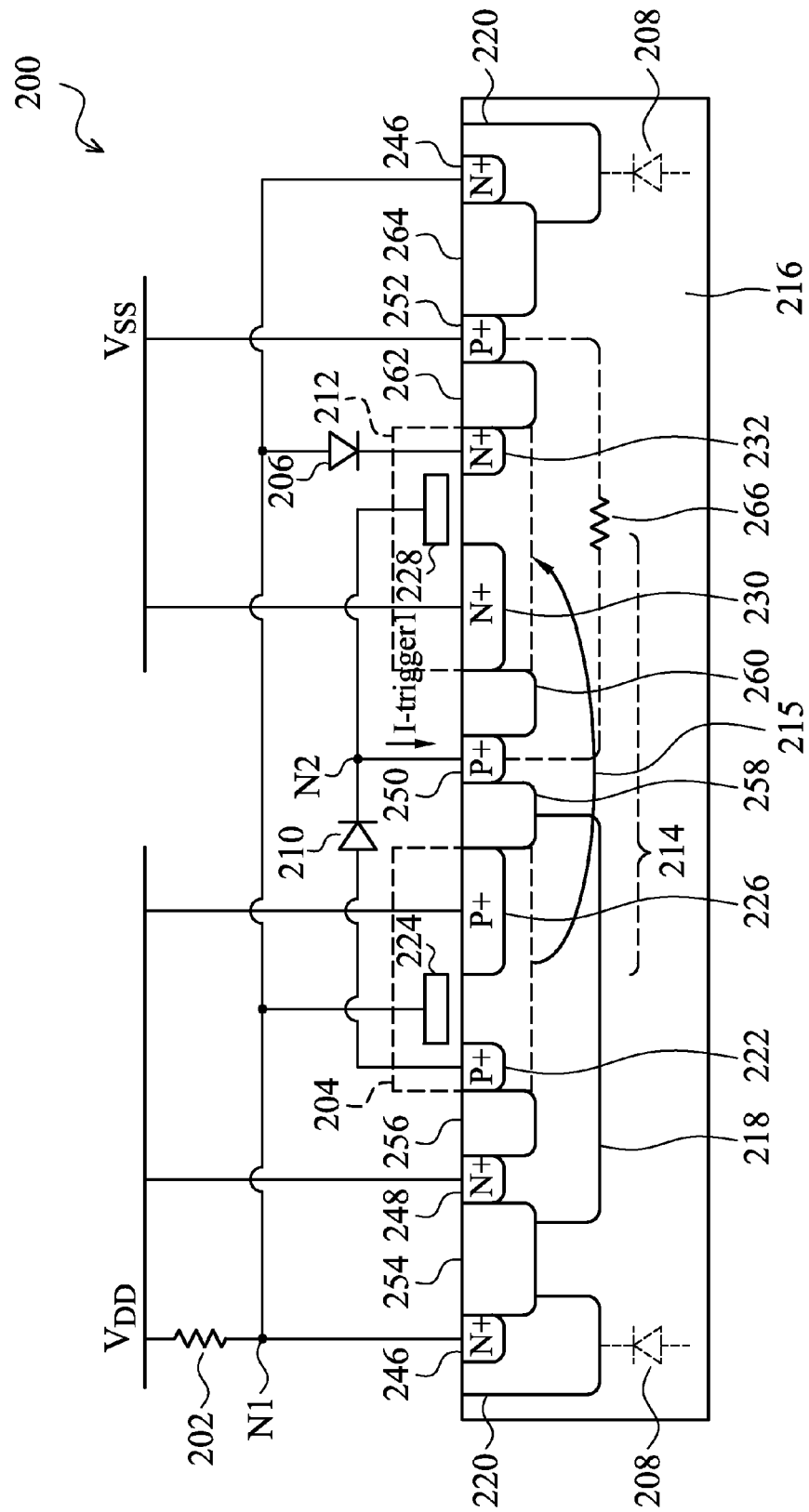
FIG. 2B is a layout of the electrostatic discharge protection circuit shown in FIG. 2A.

FIG. 2B is the layout of the electrostatic discharge protection circuit 200. As shown in FIG. 2B, the electrostatic discharge protection circuit 200 includes a substrate 216, a first resistor 202, a first diode 210 and a second diode 206. The diode device 208 can be replaced by the other capacitance components, such as plate capacitors, MOS capacitors or the same. The substrate 216 includes a first N-well 218, at least one second N-well 220, a diode device 208, a p-type field effect transistor 204 and an n-type field effect transistor 212.

The substrate 216 further has a first contact point (that is, the p-type doped region 252) and a fourth contact point (that is, the p-type doped region 250). The first and fourth contact points are coupled to the rail $V_{SS}$ and the cathode of the first diode 210, respectively. The first resistor 202 has a first terminal coupled to the rail $V_{DD}$ and a second terminal coupled to the anode of the second diode 206. The first N-well 218 is formed on the substrate 216 and has a second contact point (that is, n-type doped region 248) coupled to the rail $V_{DD}$. The second N-well 220 is formed on the substrate 216 and has a third contact point (that is, n-type doped region 246) coupled to the second terminal of the first resistor 202. The diode device 208 is a capacitance diode constructed by the second N-well 220 and the substrate 216. It should be noted that the substrate 216 can be a p-type semiconductor substrate or a p-type semiconductor substrate having a P-well, wherein the n-type field effect transistor 212 is formed in the P-well. In another embodiment, the diode device 208 can be a common capacitor device and coupled between the second terminal of the first resistor 202 and the rail $V_{SS}$.

The p-type field effect transistor 204 is formed on the first N-well 218, constructed by the first p-type doped region 222, the first gate 224 and the second p-type doped region 226. The first p-type doped region 222 is the drain of the p-type field effect transistor 204 and is formed in the first N-well region 218 and coupled to the anode of the first diode 210. The first gate 224 is the gate of the p-type field effect transistor 204, and coupled to the second terminal of the first resistor 202 (that is the first node N1). The second p-type doped region 226 is the source of a p-type field effect transistor 204 and is formed in the first N-well 218 and coupled to the rail $V_{DD}$.

The n-type field effect transistor 212 is formed on the substrate 216, constructed by the second gate 228, the first n-type doped region 230 and the second n-type doped region 232. The second gate 228 is coupled to the cathode of the first diode 210. The first n-type doped region 230 is the source of n-type field effect transistor 212 and is formed on the substrate 216 and coupled to the rail $V_{SS}$. The second n-type doped region 232 is the drain of n-type field effect transistor 212 and is formed on the substrate 216 and coupled to the cathode of the second diode 206.

Figure 2C:
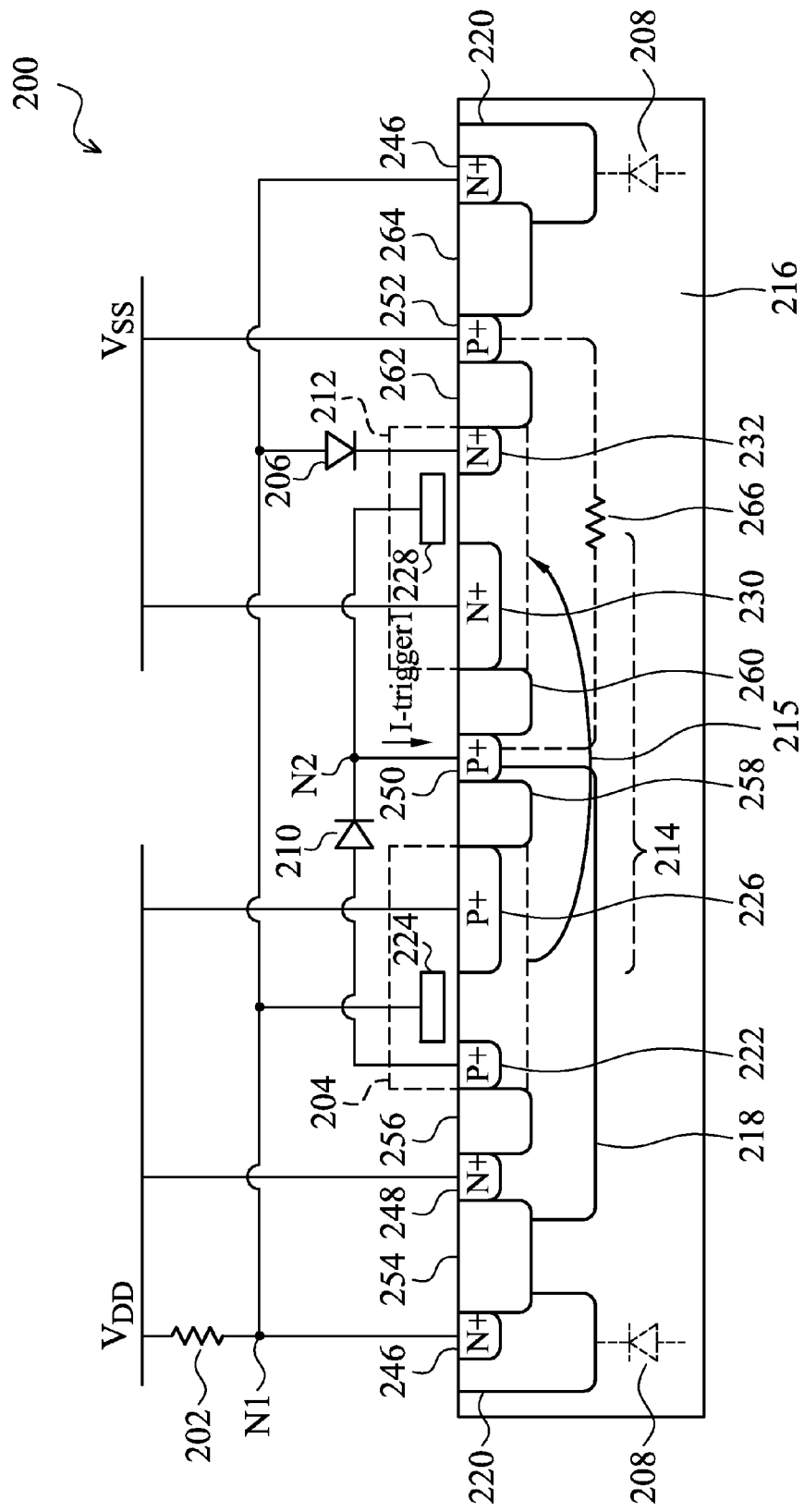
FIG. 2C is another layout of the electrostatic discharge protection circuit shown in FIG. 2A.

The substrate 216 further includes the parasitic silicon controlled rectifier 214, the n-type doped regions 246-248, the p-type doped regions 250-252 and the shallow trench isolations 254-264. In this embodiment, the second p-type doped region 226 of the p-type field effect transistor 204, the N-well 218, the substrate 216 and the first n-type doped region 230 of the n-type field effect transistor 212 form a parasitic silicon controlled rectifier 214 in the substrate 216. Moreover, the fourth contact point (that is, p-type doped region 250), which is coupled to the cathode of the first diode 210, is arranged to be a control terminal of the parasitic silicon controlled rectifier 214. The n-type doped regions 246 and 248 serve as the third contact point (that is, n-type doped region 246) and the second contact (that is, the n-type doped region 248), respectively. The p-type doped regions 250 and 252 serves as the fourth contact point (that is, the p-type doped region 250) and the first contact point (that is, the p-type doped region 252), respectively. The shallow trench isolation 254-264 is deposited between the doped regions to isolate the doped regions. For instance, the shallow trench isolation 254 is arranged to isolate the n-type doped region 246 of the second N-well 220 and the n-type doped region 248 of the first N-well 218. The shallow trench isolation 256 is arranged to isolate the n-type region 248 and the first p-type doped region 222 of the p-type field effect transistor 204. The shallow trench isolation 258 is arranged to isolate the second p-type doped region 226 of the p-type field effect transistor 204 and the p-type doped region 250 of the substrate 216. The shallow trench isolation 260 is arranged to isolate the first n-type doped region 230 of n-type field effect transistor 212 and the p-type doped region 250 of the substrate 216. The shallow trench isolation 262 is arranged to isolate the second n-type doped region 232 of the n-type field effect transistor 212 and the p-type doped region 252 of the substrate 216. The shallow trench isolation 264 is arranged to isolate the p-type doped region 252 of the substrate 216 and the n-type doped region 246 of the second N-well 220. Furthermore, the first N-well 218 of the electrostatic discharge protection circuit 200 can also be laterally extended to be under the fourth contact point (that is, under the p-type doped region 250), as FIG. 2C shows.

When an electrostatic discharge event occurs, the electrostatic discharge protection circuit 200 of FIGS. 2A and 2B discharges the electrostatic current from the rail $V_{DD}$ to the rail $V_{SS}$ to protect the chip. At this time, the voltage level at the gate of the p-type field effect transistor 204 (i.e., the first gate 224) is lower than that at the rail $V_{DD}$ because of the RC delay formed by the first resistor 202 and diode device 208. Therefore, the p-type field effect transistor 204 is conducted by the voltage difference between the source and gate thereof.

The conducted p-type field effect transistor 204 turns on the first diode 210 to produce the trigger current I-trigger1, which is output to the fourth contact point (that is, the p-type doped region 250) to trigger the parasitic silicon controlled rectifier 214. After the parasitic silicon controlled rectifier 214 is triggered, the parasitic silicon controlled rectifier 214 discharges the electrostatic current from the rail $V_{DD}$ to the rail $V_{SS}$. In the meantime, the voltage of the second node N2 is increased because the p-type field effect transistor 204 and the first diode 210 are turned on, and the n-type field effect transistor 212 is turned on by the voltage difference of the source (that is, the first n-type doped region 230) and the gate (that is, the second gate 228). The conducted n-type field effect transistor 212 turns on the second diode 206. Since the second diode 206 is turned on, the voltage of the first node N1 is decreased, such that the current on the conducted p-type field effect transistor 204 is increased. In light of the foregoing, the p-type field effect transistor 204 and n-type field effect transistor 212 constitute a loop, such that the p-type field effect transistor 204 and n-type field effect transistor 212 are fully conducted (i.e., turned on) and provide the trigger current to the silicon controlled rectifier 214 continuously. Furthermore, as the FIG. 2B shows, the fourth contact point (that is, the p-type doped region 250) and the first contact point (that is, the p-type doped region 252) forms a parasitic resistor 266 in the substrate 216.

Figure 2D:
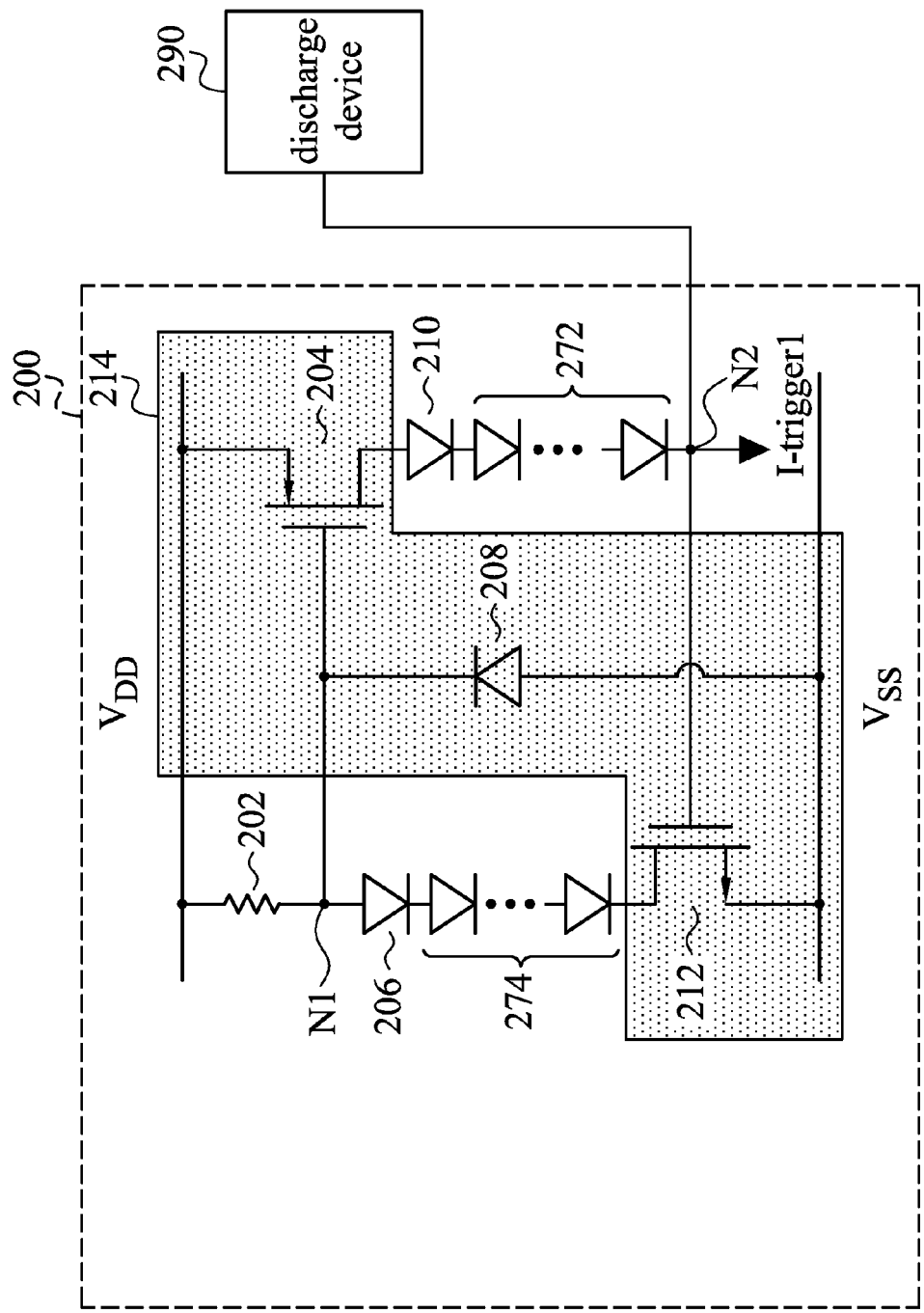
FIG. 2D is a schematic view showing another embodiment of the electrostatic discharge protection circuit of FIG. 2A.

In another embodiment, the electrostatic discharge protection circuit 200 of FIGS. 2A and 2B further comprises a first diode string 272 and a second diode string 274 as FIG. 2D shows. The first diode string 272 at least includes a diode having an anode coupled to the cathode of the first diode 210 and a cathode coupled to the second node N2. The second diode string 274 at least includes a diode having an anode coupled to the cathode of the second diode 206 and a cathode coupled to the drain of n-type field effect transistor 212. As described above, the second diode string 274 is coupled with the second diode 206 in series. The voltage difference between the gate (that is, the second gate 228) and the drain (that is, the n-type doped region 232) of n-type fled effect transistor 212 can be decreased by tuning the diode number of the second diode string 274 to reduce the leakage of the n-type field effect transistor 212. In a similar way, the first diode string 272 and the first diode 210 are coupled in series, and the leakage of the p-type field effect transistor 204 can be reduced as the voltage difference between the gate (that is, the first gate 224) and the drain (that is, the p-type doped region 222) of the p-type field effect transistor 204 is reduced by tuning the diode number of the first diode string 272.

Figure 5A:
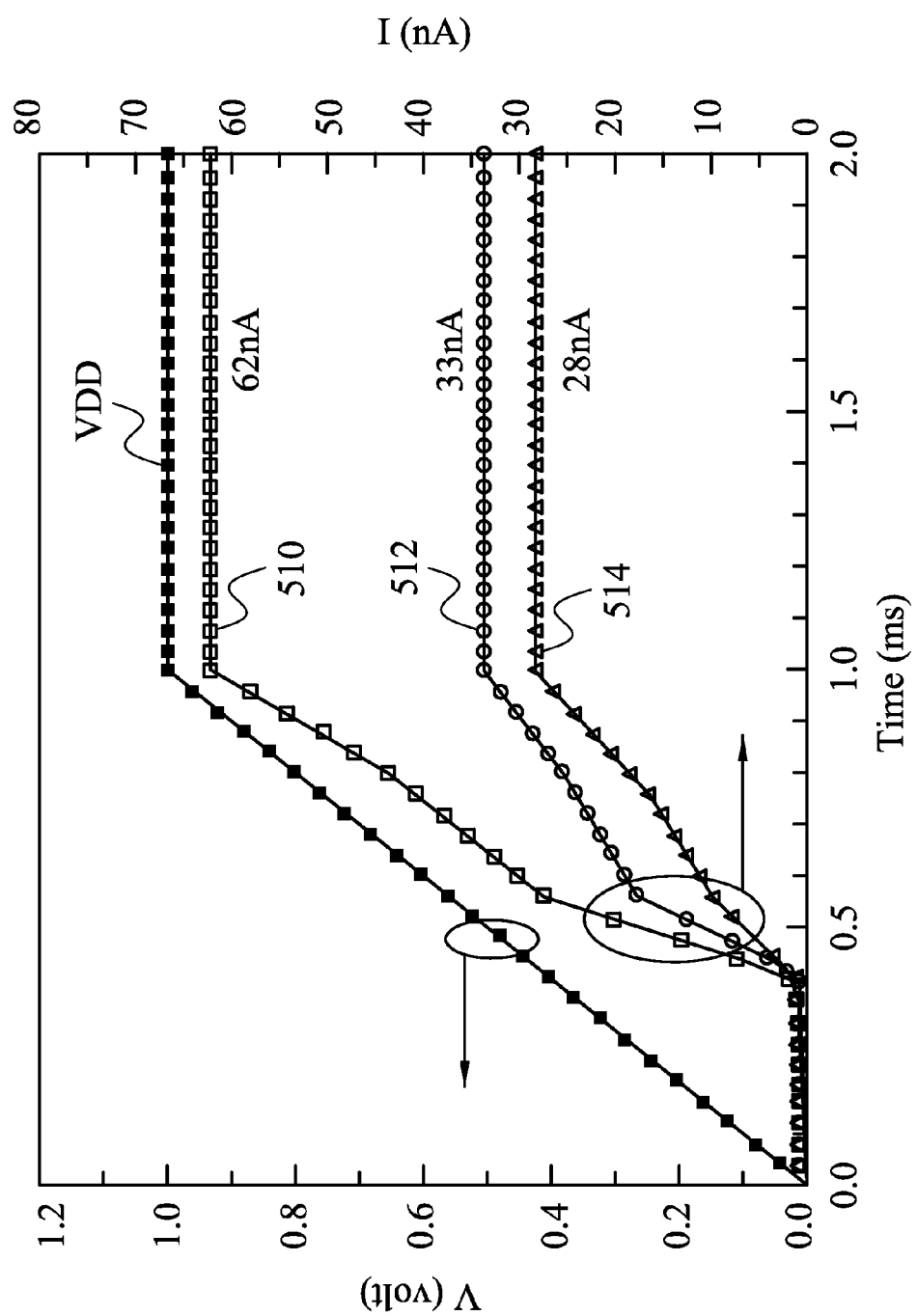
FIG. 5A is a simulation diagram of leakage current in the disclosure.
Figure 5B:
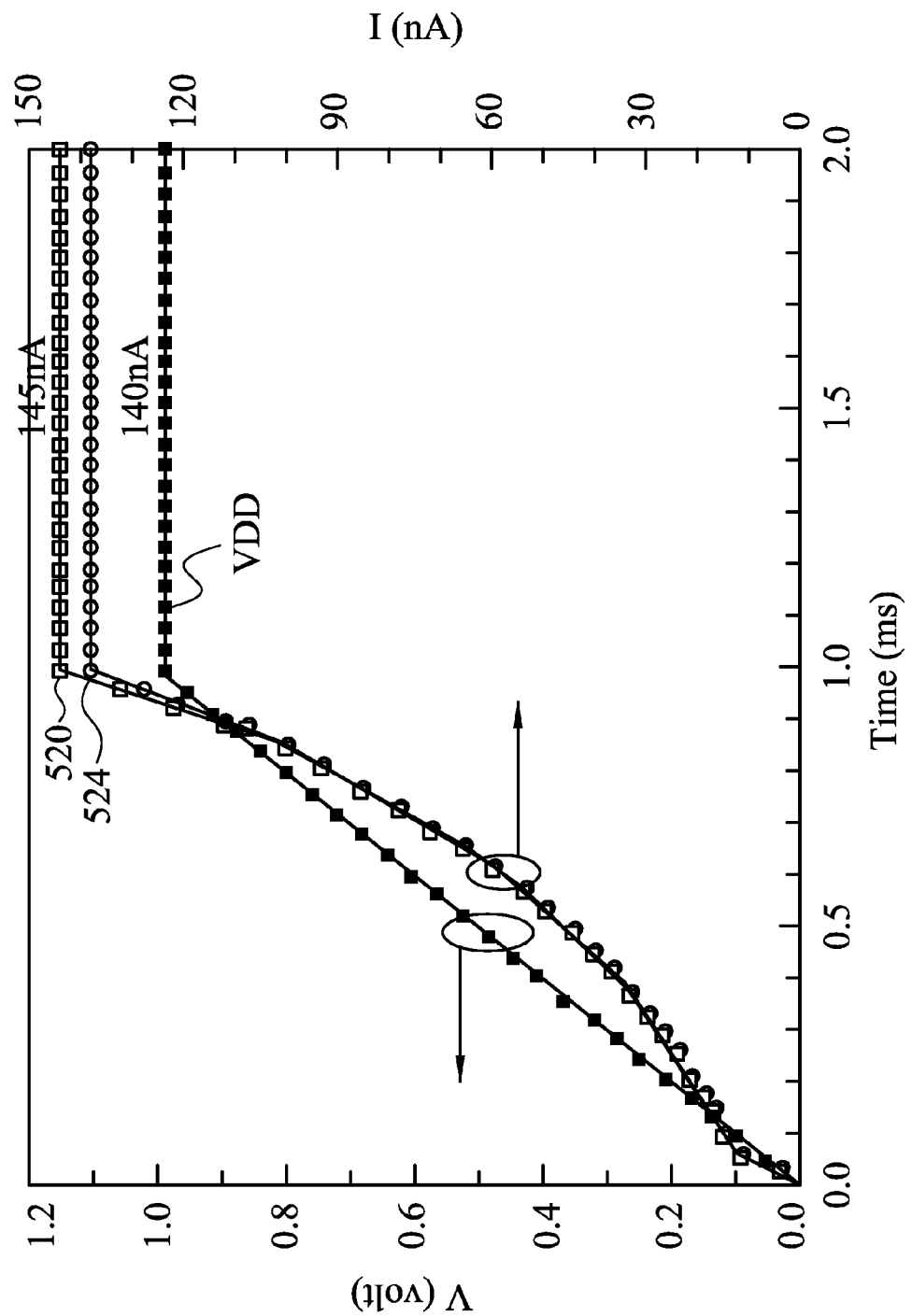
FIG. 5B is a simulation diagram of leakage current in the conventional electrostatic discharge protection circuit.

FIG. 5A is a simulation diagram of leakage current in the embodiment. As the FIG. 5A shows, when the voltage at the rail $V_{DD}$ is 1V and the pulse rise time is 1 ms, the total leakage 510 of the electrostatic discharge protection circuit 200 is 62 nA, wherein the drain leakage 512 of the n-type field effect transistor 212 is 33 nA and the drain leakage 514 of the p-type field effect transistor 204 is 28 nA. FIG. 5B is a simulation diagram of leakage current in the conventional electrostatic discharge protection circuit 100, wherein when the voltage at the rail $V_{DD}$ is 1V and the pulse rise time is 1 ms, the total leakage 520 of the electrostatic discharge protection circuit 100 is 145 nA, and the drain leakage 524 of the p-type field effect transistor 104 is 140 nA.

Based on the FIGS. 5A and 5B, it can be known that, in the same situation, the total leakage 510 of the electrostatic discharge protection circuit 200 of the invention has a 2.5 times drastic reduction of leakage current, when compared to the total leakage 520 of the conventional electrostatic discharge protection circuit 100.

Figure 6B:
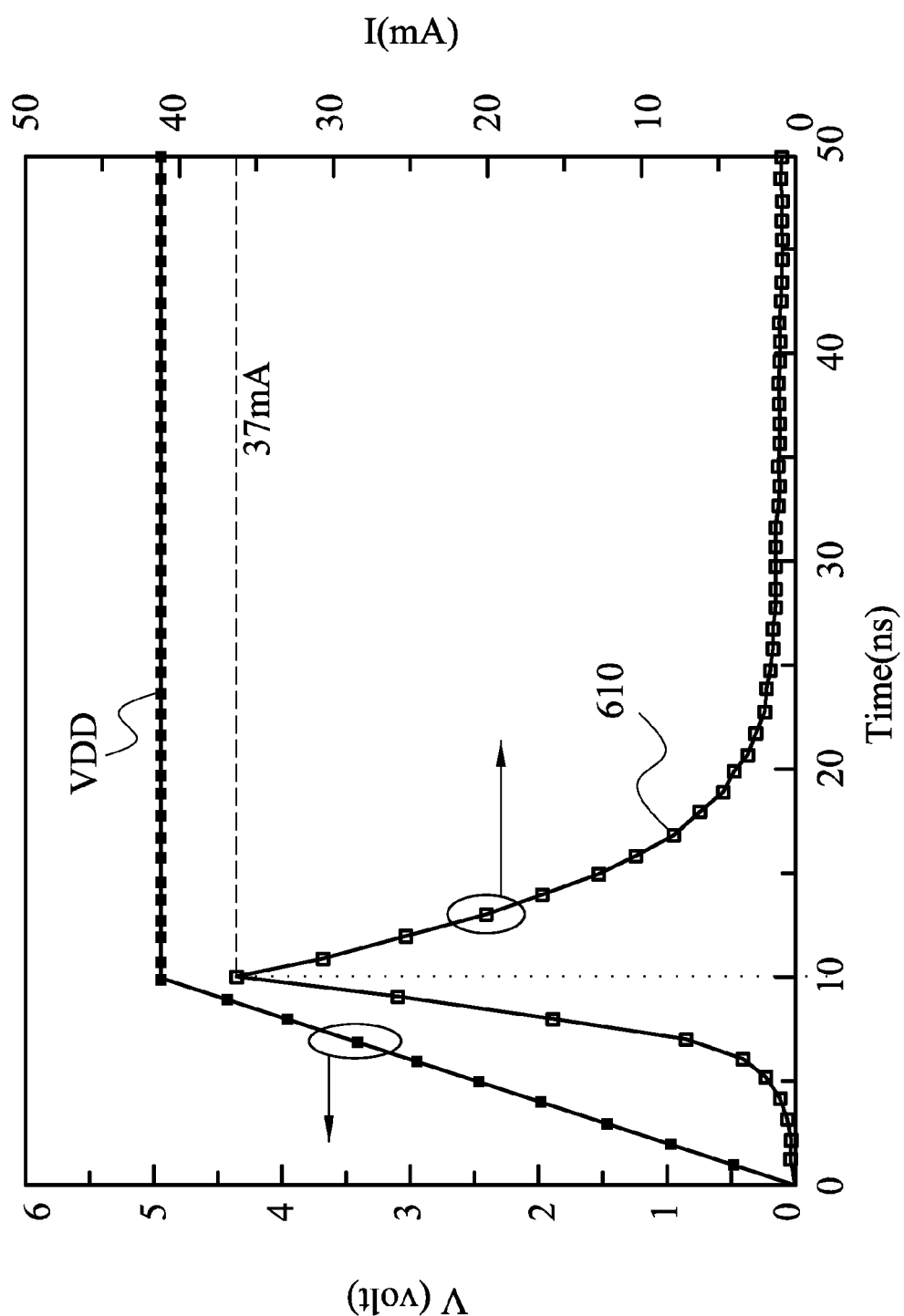
FIG. 6B is a simulation diagram of trigger current in the conventional electrostatic discharge protection circuit.

FIG. 6A is a simulation diagram of the trigger current in the embodiment. As the FIG. 6A shows, when the voltage at the rail $V_{DD}$ is 5V and the pulse rise time is 10 ns, the trigger current I-trigger1 of the electrostatic discharge protection circuit 200 can reach 37 mA at 7 ns and 73 mA at 10 ns. FIG. 6B is a simulation diagram of the trigger current in the conventional electrostatic discharge protection circuit 100, wherein when the voltage at the rail $V_{DD}$ is 5V and the pulse rise time is 10 ns, the trigger current 610 of the electrostatic discharge protection circuit 100 can reach 37 mA until 10 ns.

Based on the FIGS. 6A and 6B, it can be known that, in the same situation, the trigger current I-trigger1 of electrostatic discharge protection circuit 200 of the embodiment has a significant 2 times increase of the trigger current and a 33 percent forward of the trigger speed, when compared to those of the trigger current 610 of the conventional electrostatic discharge protection circuit 100.

Figure 3A:
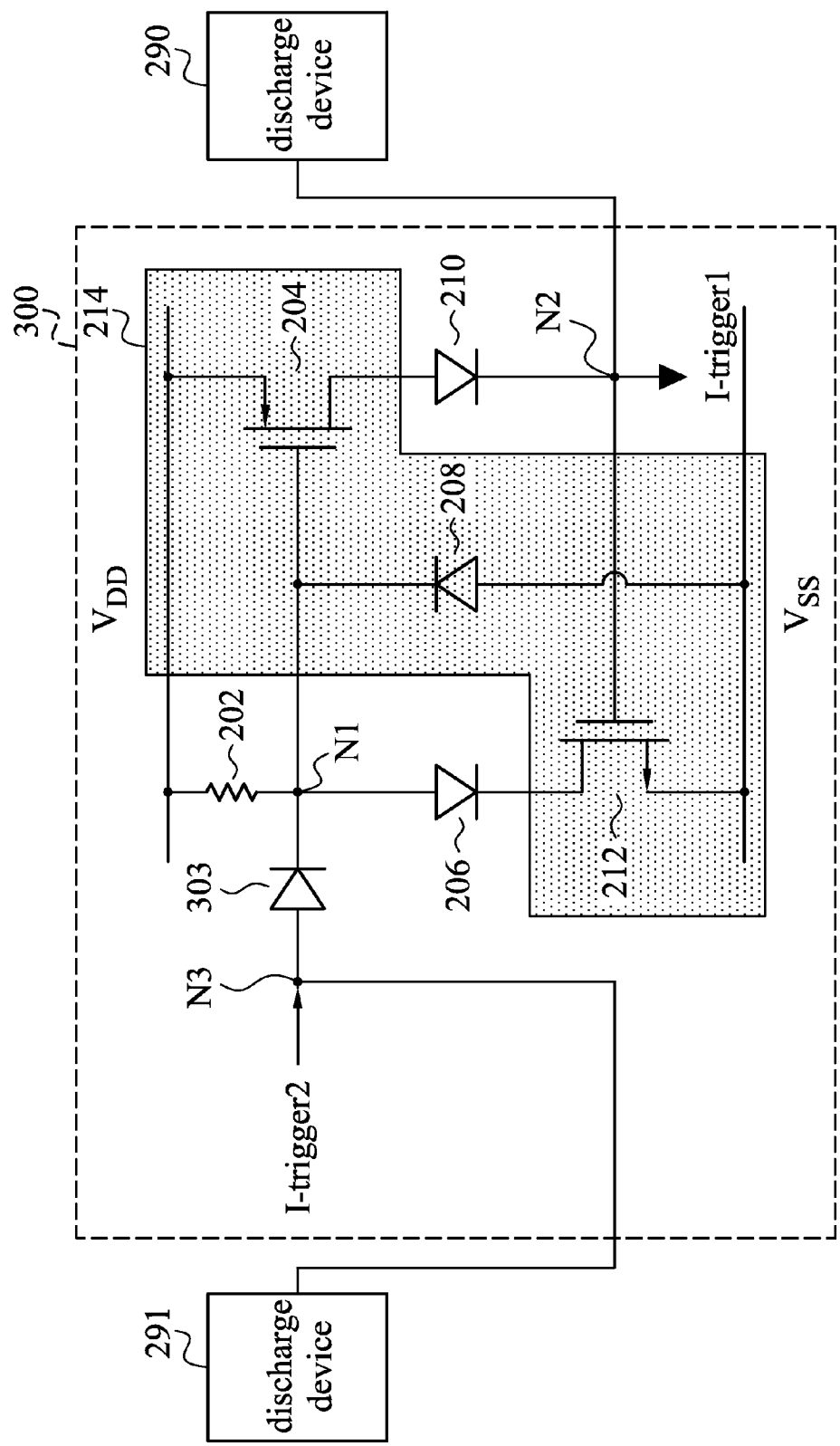
FIG. 3A is a schematic view showing another embodiment of the electrostatic discharge protection circuit.

FIG. 3A is a schematic view showing another embodiment. As shown of the FIG. 3A, the electrostatic discharge protection circuit 300 includes the first resistor 202, a third diode 303, the p-type field effect transistor 204, the second diode 206, the diode device 208, the first diode 210 and the n-type field effect transistor 212. The electrostatic discharge protection circuit 300 is similar to the electrostatic discharge protection circuit 200 in FIG. 2A. The difference is that the electrostatic discharge protection circuit 300 further includes the third diode 303. The third diode 303 has a cathode coupled to the first node N1 and an anode coupled to the third node N3. Furthermore, the third diode 303 is arranged to draw the trigger current I-trigger2 to the third node N3. For simplification, the circuit connection of the electrostatic discharge protection circuit 300 will not be described in detail here. Reference may be made to the description of FIG. 2A.

It should be noted that the diode device 208 serves as a capacitance device and is arranged to construct an RC circuit with the first resistor 202. In some embodiments, the diode device 208 has a first terminal coupled to the second node N2 and a second terminal coupled to the first node N1, and the diode device 208 can be replaced by other capacitance components, such as plate capacitors, MOS capacitors or the same. Compared with the other capacitance component, the diode device 208 can reduce the area of the electrostatic discharge protection circuit 300. In addition, the electrostatic discharge protection circuit 300 further comprises a parasitic silicon controlled rectifier 214 which is constructed by the p-type field effect transistor 204 and the n-type field effect transistor 212. The parasitic silicon controlled rectifier 214 has a control terminal coupled to the second node N2 and another controller terminal coupled to the third node N3. The control terminals can trigger the parasitic silicon controlled rectifier 214 by the trigger current I-trigger1 and I-trigger2. When an electrostatic discharge event occurs, the parasitic silicon controlled rectifier 214 provides a discharge path to protect the chip. In another embodiment, the electrostatic discharge protection circuit 300 can further be coupled to the discharge devices 290 and 291 (e.g., clamp device or other silicon controlled rectifier device) between the rail $V_{DD}$ and $V_{SS}$. During an electrostatic discharge event, the discharge devices 290 and 291 can be respectively triggered by the second node N2 and the third node N3 of the electrostatic discharge protection circuit 300 respectively to provide discharge paths to the chip. Furthermore, the discharge device 290 can be simultaneously triggered by the second node N2 and third node N3 of the electrostatic discharge protection circuit 300. Namely, the second node N2 and the third node N3 are coupled to the same discharge device 290, as shown in FIG. 3E. Note that, the electrostatic discharge protection circuit 300 can be regarded as a detecting circuit after coupled to the discharge devices 290 and/or 291.

Figure 3B:
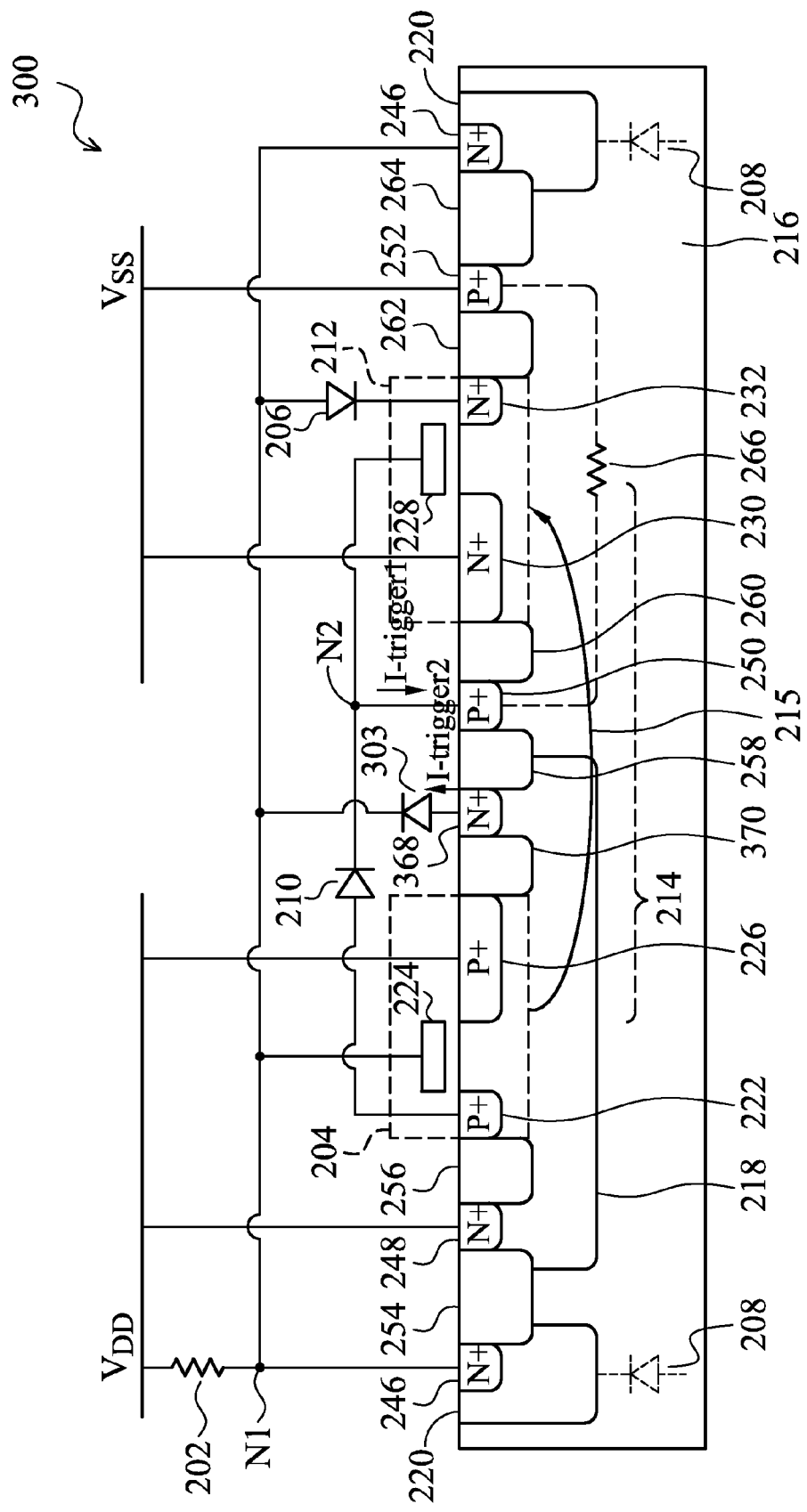
FIG. 3B is a layout of the electrostatic discharge protection circuit shown in FIG. 3A.
Figure 3C:
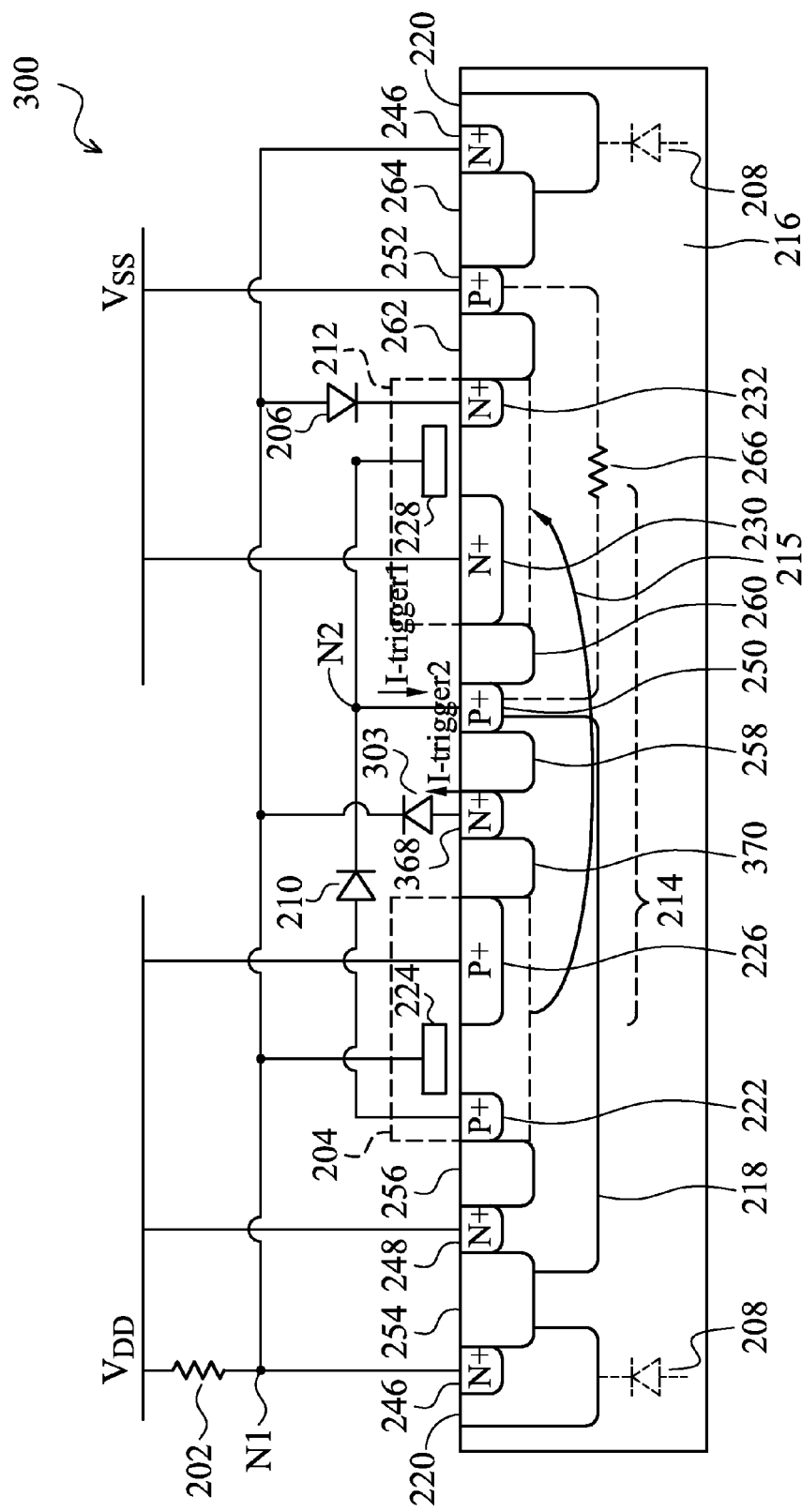
FIG. 3C is another layout of the electrostatic discharge protection circuit shown in FIG. 3A.
Figure 3D:
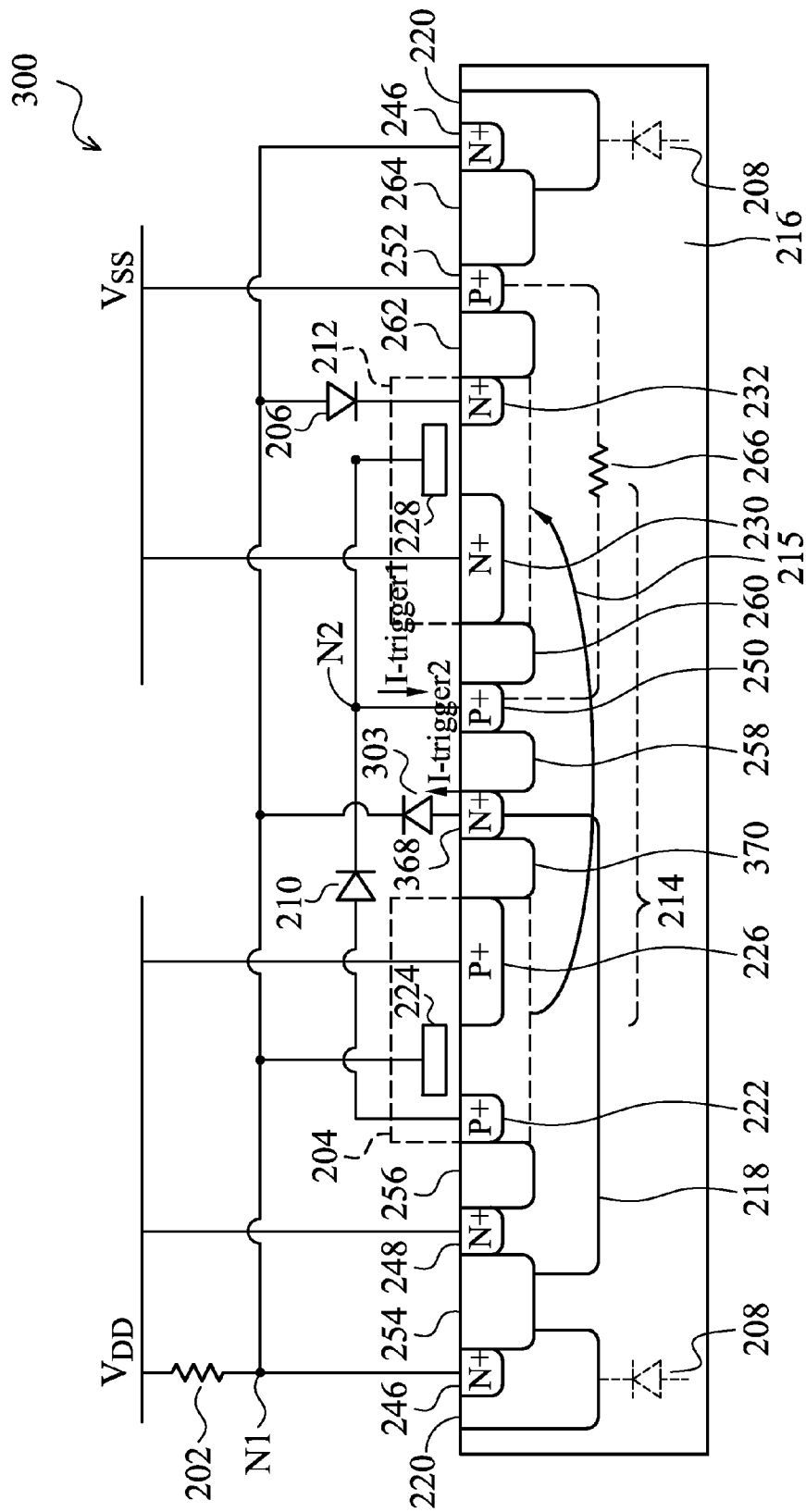
FIG. 3D is another layout of the electrostatic discharge protection circuit shown in FIG. 3A.
Figure 3E:
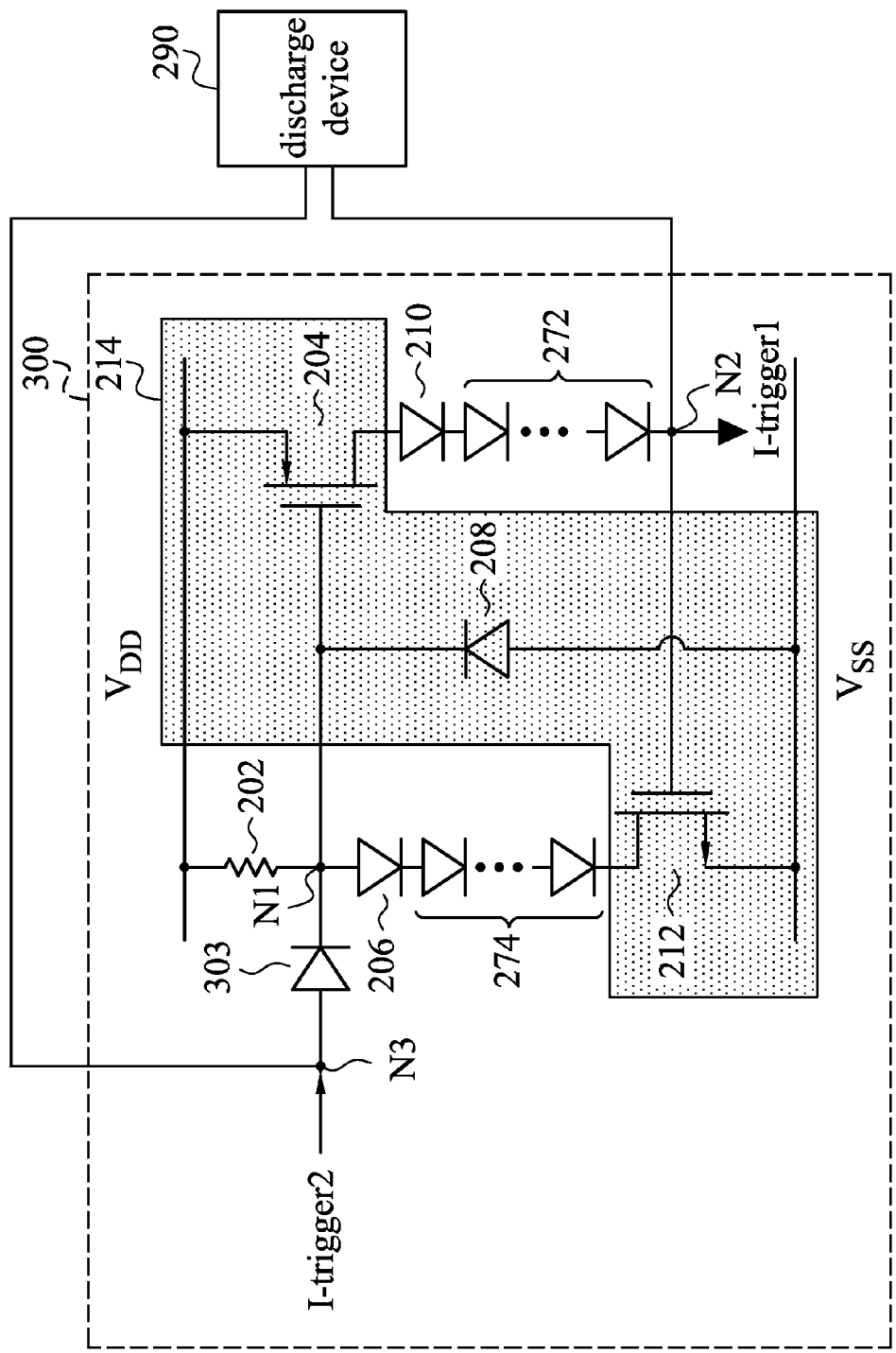
FIG. 3E is a schematic view showing another embodiment of the electrostatic discharge protection circuit of FIG. 3A.

FIG. 3B is the layout of the electrostatic discharge protection circuit 300. The electrostatic discharge protection circuit 300 includes the substrate 216, the first resistor 202, the first diode 210, the second diode 206 and the diode device 208. The diode device 208 can be replaced by the other capacitance components, such as plate capacitors, MOS capacitors or the same. The electrostatic discharge protection circuit 300 is similar to the electrostatic discharge protection circuit 200 in FIG. 2B. The difference is that the electrostatic discharge protection circuit 300 further includes the third diode 303. Moreover, the substrate 216 further includes the fifth contact point (that is, the n-type doped region 368), the n-type doped region 368 and the shallow trench isolation 370. The third diode 303 has a cathode coupled to the first node N1 and an anode coupled to the fifth contact point (that is, the n-type doped region 368). The fifth contact point (that is, the n-type doped region 368) is deposited between the second p-type doped region 226 and the first n-type doped region 230, and used to couple the first N-well 218 to the anode of third diode 303. For simplification, the circuit connection of the electrostatic discharge protection circuit 300 will not be described in detail here. Reference may be made to the description of FIG. 2B. It should be noted that the substrate 216 can be a p-type semiconductor substrate or a p-type semiconductor substrate having a P-well, wherein the n-type field effect transistor 212 is formed in the P-well. In another embodiment, the diode device 208 can be the common capacitor device and coupled between the second terminal of the first resistor 202 and the rail $V_{SS}$. Furthermore, the first N-well 218 of the electrostatic discharge protection circuit 300 can also be laterally extended to be under the fourth contact point (that is, under the p-type doped region 250), as FIG. 3C shows. In another embodiment, the electrostatic discharge protection circuit 300 can even be laterally extended to be under the fifth contact point (that is, under the n-type doped region 368), as FIG. 3D shows.

When an electrostatic discharge event occurs, similar with the electrostatic discharge protection circuit 200 of FIGS. 2A and 2B, the electrostatic discharge protection circuit 300 of FIGS. 3A and 3B discharges the electrostatic from the rail $V_{DD}$ to the rail $V_{SS}$ to protect the chip. Similar with the discharge paths of the electrostatic discharge protection circuit 200, the discharge paths of the electrostatic discharge protection circuit 300 is provided by the parasitic silicon controlled rectifier 214. The operations of the electrostatic discharge protection circuit 300 are similar to 200, which are not described in detail here. The difference between the electrostatic discharge protection circuits 300 and 200 is that the electrostatic discharge protection circuit 300 further includes a trigger mechanism by drawing a current.

During an electrostatic discharge event, the n-type field effect transistor 212 and the second diode 206 are conducted, such that the third diode 303 is turned on to produce a trigger current I-trigger2 since the first node N1 is under a low voltage level. The parasitic silicon controlled rectifier 214 can be triggered by injecting the trigger current I-trigger1 at the fourth contact point (i.e., the p-type doped region 250) and/or drawing the trigger current I-trigger2 of the third diode 303 from the fifth contact point (i.e., the n-type doped region 368).

In another embodiment, the electrostatic discharge protection circuit 300 of FIGS. 3A and 3B further comprises a first diode string 272 and a second diode string 274 as FIG. 3E shows. The first diode string 272 at least includes a diode having an anode coupled to the cathode of the first diode 210 and a cathode coupled to the second node N2. The second diode string 274 at least includes a diode having an anode coupled to the cathode of the second diode 206 and a cathode coupled to the drain of the n-type field effect transistor 212. As described above, the second diode string 274 is coupled with the second diode 206 in series. The voltage difference between the gate (that is, the second gate 228) and the drain (that is, the n-type doped region 232) of the n-type field effect transistor 212 can be decreased by tuning the diode number of the second diode string 274 to reduce the leakage of the n-type field effect transistor 212. In a similar way, the first diode string 272 and the first diode 210 are coupled in series, and the leakage of the p-type field effect transistor 204 can be reduced as the voltage difference between the gate (that is, the first gate 224) and the drain (that is, the p-type doped region 222) of the p-type field effect transistor 204 is reduced by tuning the diode number of the first diode string 272.

Figure 4A:
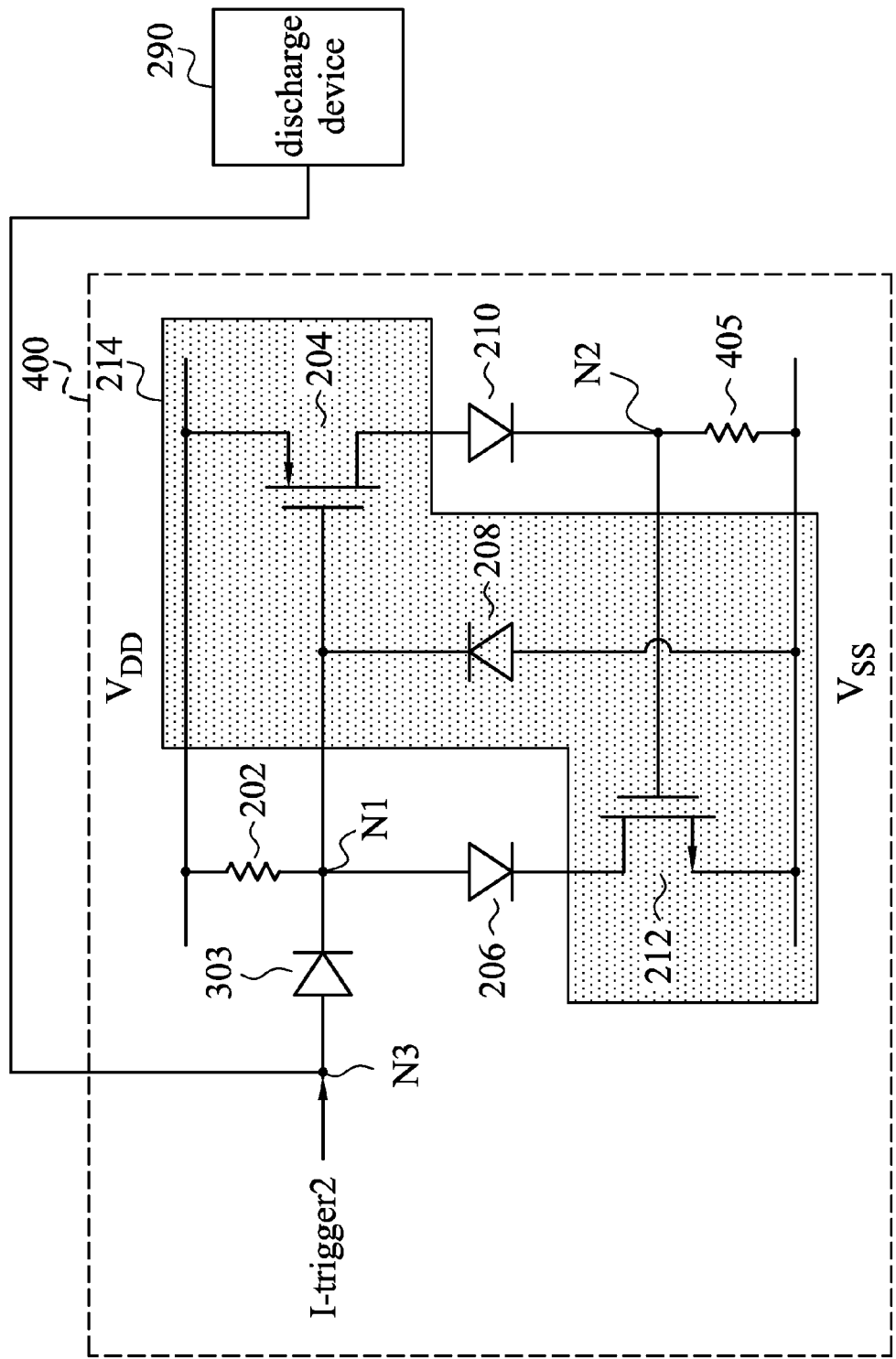
FIG. 4A is a schematic view showing another embodiment of the electrostatic discharge protection circuit.

FIG. 4A is a schematic view showing an embodiment disclosed by this disclosure. As shown of the FIG. 4A, the electrostatic discharge protection circuit 400 includes the first resistor 202, a second resistor 405, the p-type field effect transistor 204, the first diode 210, the second diode 206, the third diode 303, the diode device 208 and the n-type field effect transistor 212. The electrostatic discharge protection circuit 400 of this embodiment is similar to the electrostatic discharge protection circuit 300 in FIG. 3A. The difference is that the electrostatic discharge protection circuit 400 further includes the second resistor 405. The second resistor 405 has a first terminal coupled to the rail $V_{SS}$ and a second terminal coupled to the second node N2. For simplification, the circuit connection of the electrostatic discharge protection circuit 400 will not be described in detail here. Reference may be made to the description of FIG. 3A. It should be noted that the diode device 208 serves as a capacitance device and is arranged to construct an RC circuit with the first resistor 202. In some embodiments, the diode device 208 has a first terminal coupled to the second node N2 and a second terminal coupled to the first node N1, and the diode device 208 can be replaced by other capacitance components, such as plate capacitors, MOS capacitors or the same. Compared with the other capacitance components, the diode device 208 can reduce the area of the electrostatic discharge protection circuit 400. In addition, the electrostatic discharge protection circuit 400 further comprises a parasitic silicon controlled rectifier 214 which is constructed by the p-type field effect transistor 204 and the n-type field effect transistor 212. The parasitic silicon controlled rectifier 214 has a terminal coupled to the anode of third diode 303, such that the parasitic silicon controlled rectifier 214 can be triggered by the trigger current I-trigger2. When an electrostatic discharge event occurs, the parasitic silicon controlled rectifier 214 provides a discharge path to protect the chip. In another embodiment, the electrostatic discharge protection circuit 400 can further be coupled to the discharge device 290 (e.g., clamp device or other silicon controlled rectifier device) between the rail $V_{DD}$ and $V_{SS}$. When an electrostatic discharge event occurs, the discharge device 290 can be triggered by the third node N3 of the electrostatic discharge protection circuit 400. The discharge device 290 provides a discharge path to the chip. Note that, the electrostatic discharge protection circuit 400 can be regarded as a detection circuit after being coupled to the discharge device 290.

Figure 4B:
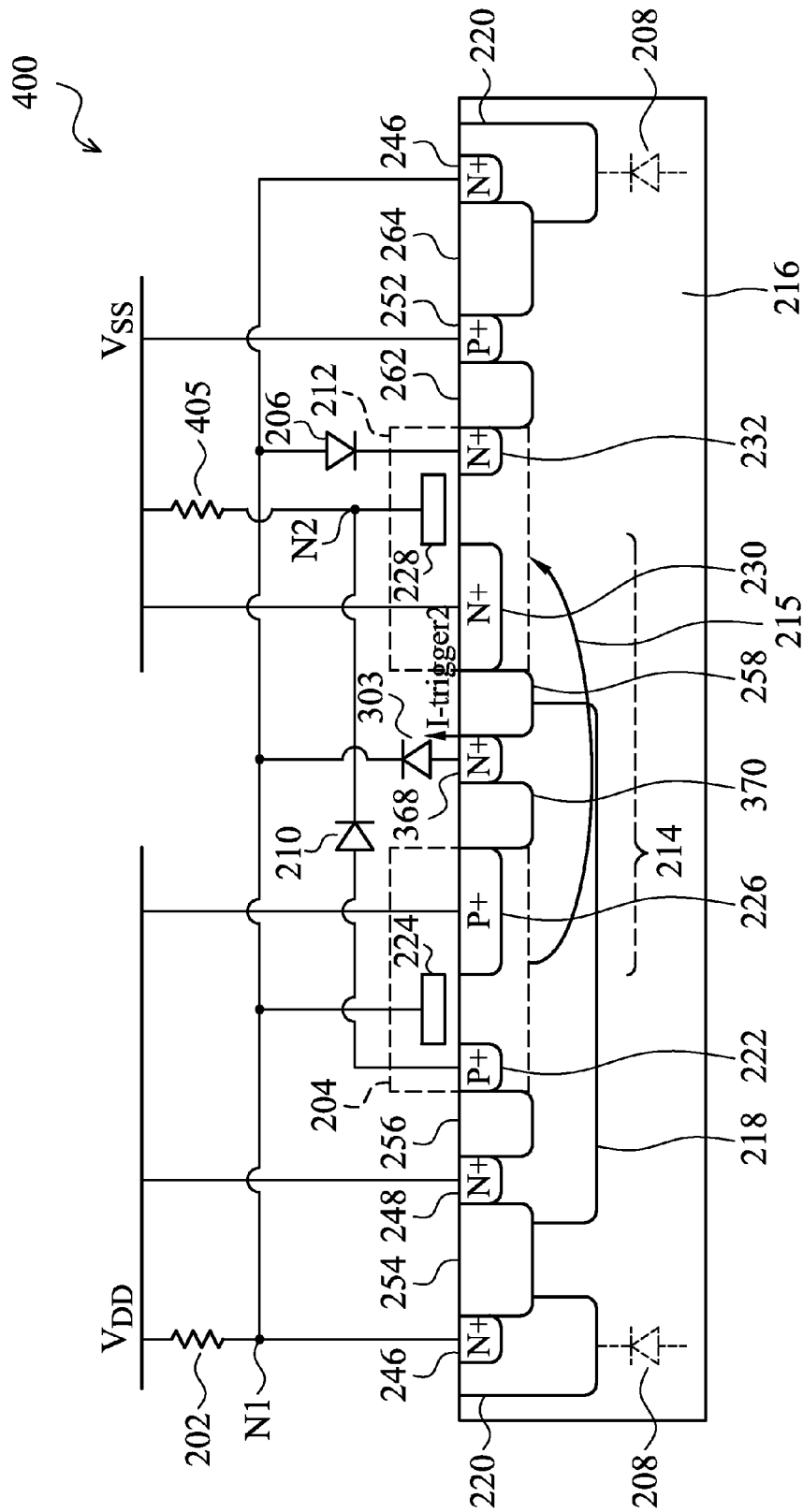
FIG. 4B is a layout of the electrostatic discharge protection circuit shown in FIG. 4A.
Figure 4C:
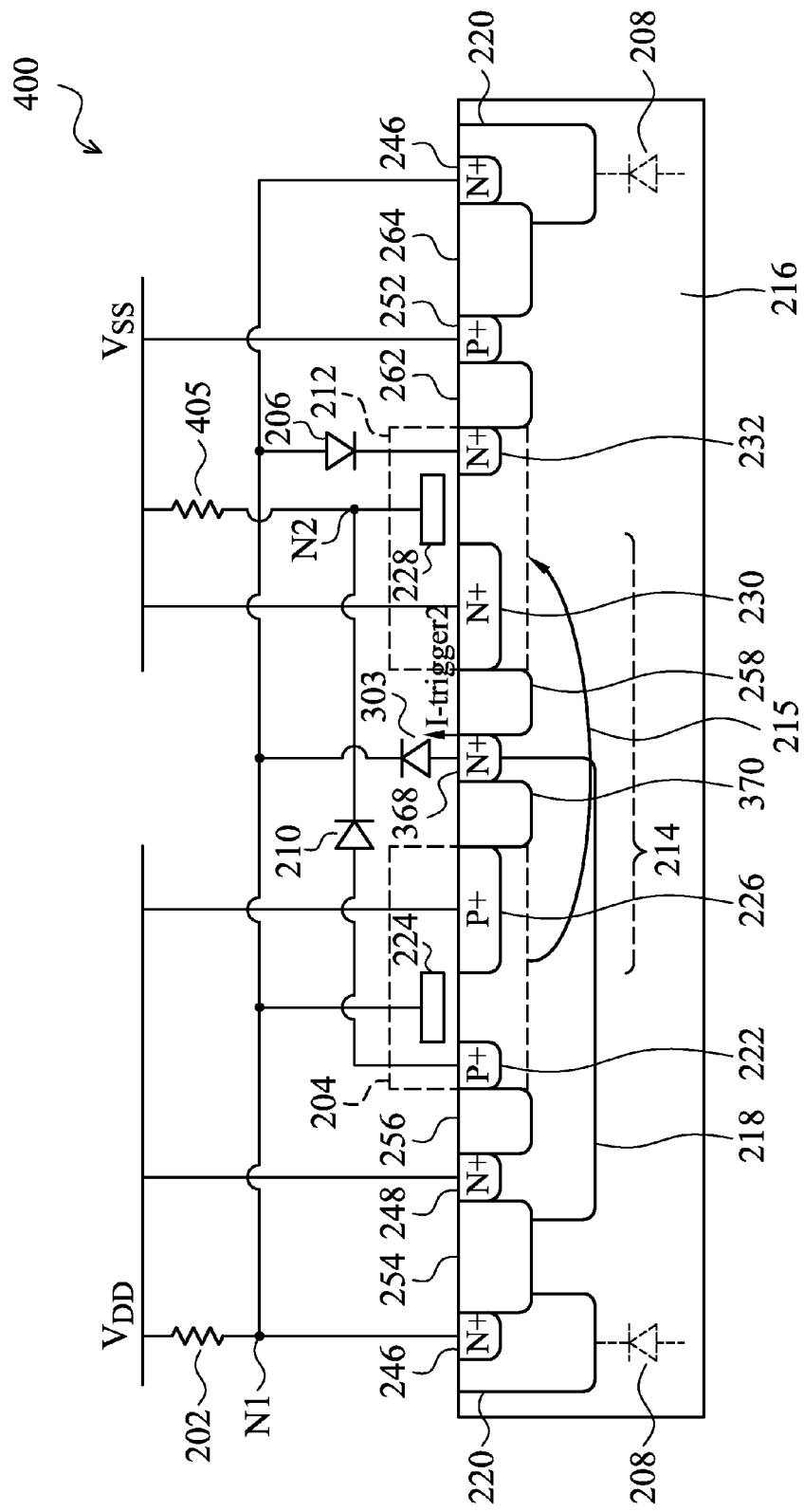
FIG. 4C is another layout of the electrostatic discharge protection circuit shown in FIG. 4A.

FIG. 4B is the layout of the electrostatic discharge protection circuit 400 of FIG. 4A. The electrostatic discharge protection circuit 400 includes the substrate 216, the first resistor 202, the second resistor 405, the first diode 210, the second diode 206, the third diode 303 and the diode device 208. The diode device 208 can be replaced by the other capacitance components, such as plate capacitors, MOS capacitors or the same. The electrostatic discharge protection circuit 400 is similar to the electrostatic discharge protection circuit 300 in FIG. 3B. The difference is that the electrostatic discharge protection circuit 400 further includes the second resistor 405 coupled between the second node N2 and the rail $V_{SS}$, and the fourth contact point is removed (that is, the p-type doped region 250), the p-type doped region 250 is removed and the shallow trench isolations 260 of the electrostatic discharge protection circuit 300 in the substrate 216 are removed. For simplification, the circuit connection of the electrostatic discharge protection circuit 400 will not be described in detail here. Reference may be made to the description of FIG. 3B. It should be noted that the substrate 216 can be a p-type semiconductor substrate or a p-type semiconductor substrate having a P-well, wherein the n-type field effect transistor 212 is formed in the P-well. In another embodiment, the diode device 208 can be the common capacitor device and coupled between the second terminal of the first resistor 202 and the rail $V_{SS}$. Furthermore, the first N-well 218 of the electrostatic discharge protection circuit 400 can also be laterally extended to be under the fifth contact point (that is, under the n-type doped region 368), as FIG. 4C shows.

When an electrostatic discharge event occurs, similar with the electrostatic discharge protection circuit 300 of FIGS. 3A and 3B, the electrostatic discharge protection circuit 400 of FIGS. 4A and 4B discharges the electrostatic from the rail $V_{DD}$ to $V_{SS}$ to protect the chip. During the electrostatic discharge event, the voltage level at the gate of the p-type field effect transistor 204 (i.e., the first gate 224) is lower than that at the rail $V_{DD}$ because of the RC delay formed by the first resistor 202 and diode device 208. Therefore, the p-type field effect transistor 204 is conducted by the voltage difference between the source and gate thereof.

The conducted p-type field effect transistor 204 turns on the first diode 210 and produces a current through the second resistor 405 to the rail $V_{SS}$. In the meantime, the voltage of the second node N2 is increased because the p-type field effect transistor 204 and the first diode 210 are conducted and the current passes through the second resistor 405. The n-type field effect transistor 212 is turned on by the voltage difference of the source (that is, the first n-type doped region 230) and the gate (that is, the second gate 228). The second diode 206 is conducted after the n-type field effect transistor 212 is conducted. Since the second diode 206 is conducted, the voltage of the first node N1 is decreased, such that the current through the conducted p-type field effect transistor 204 is increased. In light of the foregoing, the p-type field effect transistor 204 and n-type field effect transistor 212 constitute a loop circuit, such that the p-type field effect transistor 204 and n-type field effect transistor 212 can be fully conducted. The drawing way of trigger current I-trigger2 is produced by the third diode 303 due to the voltage on the first node N1 being decreased. The drawing way of the trigger current I-trigger2 is discharged through the second diode 206 and the n-type field effect transistor 212 to the rail $V_{SS}$ and produces the source of the drawing way of the trigger I-trigger2 to trigger the parasitic silicon controlled rectifier 214 by the fifth contact point (that is, n-type doped 368).

Figure 4D:
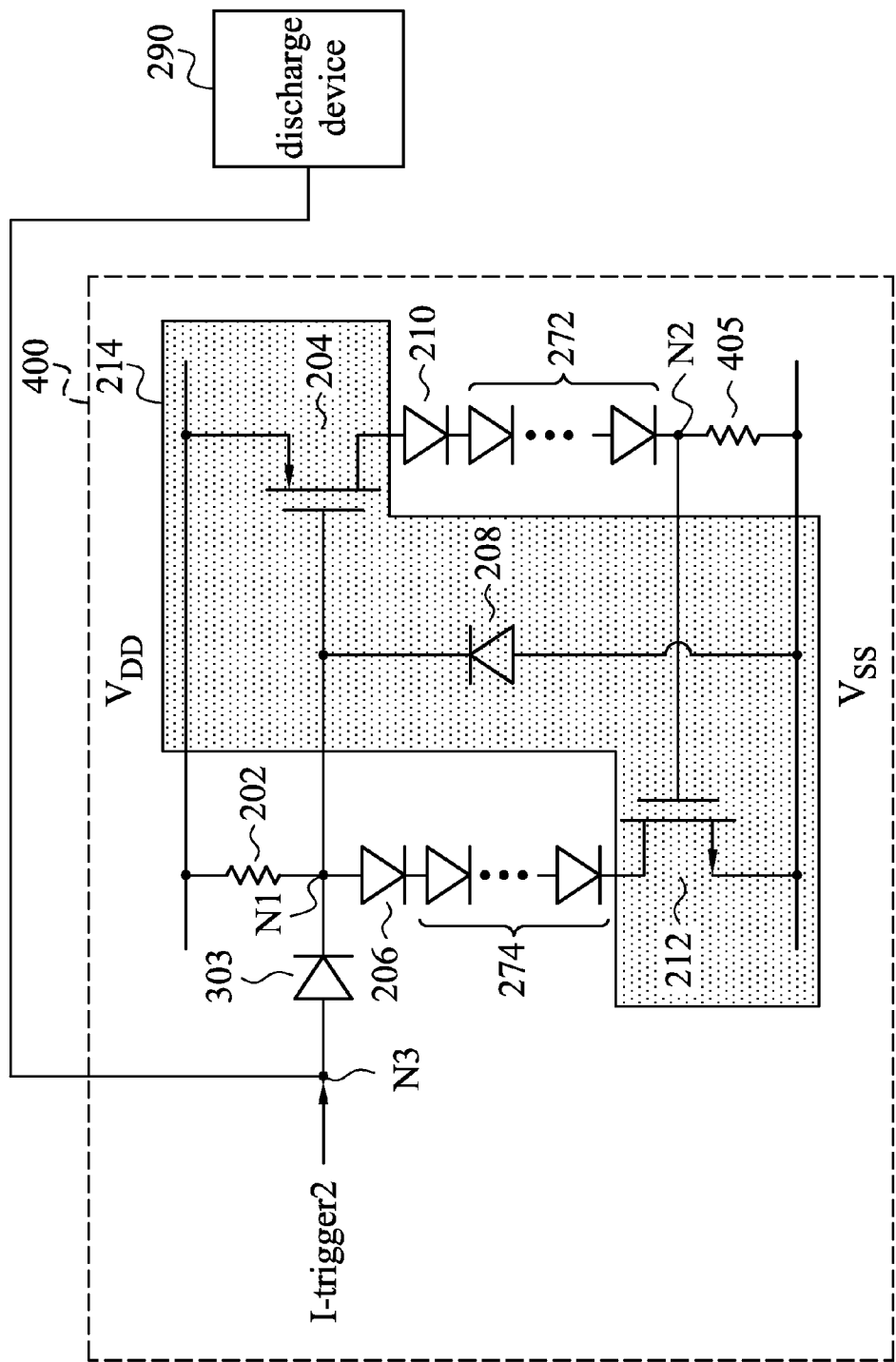
FIG. 4D is a schematic view showing another embodiment of the electrostatic discharge protection circuit of FIG. 4A.

In another embodiment, the electrostatic discharge protection circuit 400 of FIGS. 4A and 4B further comprises a first diode string 272 and a second diode string 274 as FIG. 4D shows. The first diode string 272 at least includes a diode having an anode coupled to the cathode of the first diode 210 and a cathode coupled to the second node N2. The second diode string 274 at least includes a diode having an anode coupled to the cathode of the second diode 206 and a cathode coupled to the drain of n-type field effect transistor 212. As described above, the second diode string 274 is coupled with the second diode 206 in series. The voltage difference between the gate (that is, the second gate 228) and the drain (that is, the n-type doped region 232) of the n-type field effect transistor 212 can be decreased by tuning the diode number of the second diode string 274 to reduce the leakage of the n-type field effect transistor 212. In a similar way, the first diode string 272 and the first diode 210 are coupled in series, and the leakage of the p-type field effect transistor 204 can be reduce as the voltage difference between the gate (that is, the first gate 224) and the drain (that is, the p-type doped region 222) of the p-type field effect transistor 204 is reduced by tuning the diode number of the first diode string 272.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection circuit, comprising:
    a first resistor, having a first terminal coupled to a first rail and a second terminal coupled to a first node;
    a p-type field effect transistor, having a source coupled to the first rail, a gate coupled to the first node and a drain coupled to a second node;
    a capacitance device, having a first terminal coupled to a second rail or the second node and a second terminal coupled to the first node; and
    an n-type field effect transistor, having a source coupled to the second rail, a gate coupled to the second node and a drain coupled to the first node, wherein the p-type field effect transistor is formed on a first N-well, and the first N-well and the n-type field effect transistor are formed on a substrate, the electrostatic discharge protection circuit further comprises a parasitic silicon controlled rectifier constructed by the source of the p-type field effect transistor, the first N-well, the substrate and the source of n-type field effect transistor, the parasitic silicon controlled rectifier further comprises a first control terminal coupled to the second node and/or a second control terminal coupled to a third node, the parasitic silicon controlled rectifier is triggered by injecting current into the first control terminal and/or drawing current from the second control terminal.

2. The electrostatic discharge protection circuit as claimed in claim 1, further comprising:
 a first diode, having an anode coupled to the drain of a p-type field effect transistor and a cathode coupled to the second node; and
 a second diode, having an anode coupled to the first node and a cathode coupled to the drain of the n-type field effect transistor.

3. The electrostatic discharge protection circuit as claimed in claim 1, further comprising a discharge device, having a control terminal coupled to the second node, wherein the control terminal is arranged to trigger the discharge device.

4. The electrostatic discharge protection circuit as claimed in claim 1, further comprising a third diode, having an anode coupled to a parasitic silicon controlled rectifier or a control terminal of a discharge device and a cathode coupled to the first node.

5. The electrostatic discharge protection circuit as claimed in claim 4, further comprising a second resistor, having a first terminal coupled to the second rail and a second terminal coupled to the second node.

6. The electrostatic discharge protection circuit as claimed in claim 2, further comprising:
 a first diode string, having an anode coupled to the cathode of the first diode and a cathode coupled to the second node; and
 a second diode string, having an anode coupled to the cathode of the second diode and a cathode coupled to the drain of the n-type field effect transistor.

7. The electrostatic discharge protection circuit as claimed in claim 1, wherein the capacitance device is a diode device, a plate capacitor or a MOS capacitors.

8. An electrostatic discharge protection circuit, comprising:
 a substrate, having a first contact point;
 a first resistor, having a first terminal coupled to a first rail and a second terminal;
 a first N-well, formed in the substrate and having a second contact point coupled to the first rail;
 a p-type field effect transistor, formed on the first N-well and comprising:
  a first p-type doped region, formed on the first N-well and coupled to a second node;
  a first gate, coupled to the second terminal of the first resistor; and
  a second p-type doped region, formed on the first N-well and coupled to the first rail;
 an n-type field effect transistor, formed on the substrate and comprising:
  a second gate, coupled to the second node;
  a first n-type doped region, formed on the substrate and coupled to a second rail; and
  a second n-type doped region, formed on the substrate and coupled to the second terminal of the first resistor;
 a capacitance device, having a first terminal coupled to the second rail or the second node and a second terminal coupled to the second terminal of the first resistor, wherein the second rail is coupled to the first contact point;
 a parasitic silicon controlled rectifier, wherein the parasitic silicon controlled rectifier is constructed by the second p-type doped region of the p-type field effect transistor, the first N-well, the substrate and the first n-type doped region of n-type field effect transistor; and
 a fourth contact point coupled to the second node.

9. The electrostatic discharge protection circuit as claimed in claim 8, further comprising:
 a first diode, having an cathode coupled to the second node and an anode coupled to the first p-type doped region; and
 a second diode, having a cathode coupled to the second n-type doped region and an anode coupled to the second terminal of the first resistor.

10. The electrostatic discharge protection circuit as claimed in claim 8, wherein the fourth contact point is deposited between the first n-type doped region and the second p-type doped region.

11. The electrostatic discharge protection circuit as claimed in claim 10, wherein the first N-well is laterally extended to be under the fourth contact point.

12. The electrostatic discharge protection circuit as claimed in claim 10, wherein the first N-well further comprises a fifth contact point, and the electrostatic discharge protection circuit further comprises a third diode having an anode coupled to the fifth contact point and a cathode coupled to the second terminal of the first resistor.

13. The electrostatic discharge protection circuit as claimed in claim 12, wherein the first N-well is laterally extended to be under the fourth contact point.

14. The electrostatic discharge protection circuit as claimed in claim 12, wherein the first N-well is laterally extended to be under the fifth contact point.

15. The electrostatic discharge protection circuit as claimed in claim 8, further comprising a second resistor, having a first terminal coupled to the second rail and a second terminal coupled to the second gate.

16. The electrostatic discharge protection circuit as claimed in claim 15, wherein the first N-well further comprises a fifth contact point, and the electrostatic discharge protection circuit further comprises a third diode having an anode coupled to the fifth contact point and a cathode coupled to the second terminal of the first resistor.

17. The electrostatic discharge protection circuit as claimed in claim 8, wherein the capacitance device is a diode device.

18. The electrostatic discharge protection circuit as claimed in claim 17, wherein the diode device is constructed by at least one second N-well and the substrate, and the second N-well includes a third contact point coupled to the second terminal of the first resistor.

19. The electrostatic discharge protection circuit as claimed in claim 8, wherein the capacitance device is a plate capacitor or a MOS capacitors.

20. The electrostatic discharge protection circuit as claimed in claim 9, further comprising:
 a first diode string, having an anode coupled to the cathode of the first diode and a cathode coupled to the second gate of the n-type field effect transistor; and a second diode string, having an anode coupled to the cathode of the second diode and a cathode coupled to the drain of the n-type field effect transistor.

* * * * *